us011513894B2

(12) United States Patent
Steiner et al.

(10) Patent No.: US 11,513,894 B2
(45) Date of Patent: Nov. 29, 2022

(54) HARD DECODING METHODS IN DATA STORAGE DEVICES

(71) Applicant: Kioxia Corporation, Tokyo (JP)

(72) Inventors: Avi Steiner, Kiriat Motzkin (IL); Amir Nassie, Haifa (IL); Anat Rot, Tel Aviv (IL); Ofir Kanter, Haifa (IL); Hanan Weingarten, Herzliya (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/135,722

(22) Filed: Dec. 28, 2020

(65) Prior Publication Data

US 2022/0209791 A1 Jun. 30, 2022

(51) Int. Cl.
*G06F 11/10* (2006.01)
*H03M 13/11* (2006.01)
*H03M 13/29* (2006.01)

(52) U.S. Cl.
CPC ..... *G06F 11/1068* (2013.01); *H03M 13/1105* (2013.01); *H03M 13/118* (2013.01); *H03M 13/1168* (2013.01); *H03M 13/2903* (2013.01); *H03M 13/2918* (2013.01)

(58) Field of Classification Search
CPC .......... G06F 11/1068; H03M 13/1105; H03M 13/1168; H03M 13/118; H03M 13/2903; H03M 13/2918
See application file for complete search history.

(56) References Cited

U.S. PATENT DOCUMENTS

| | | | |
|---|---|---|---|
| 7,296,212 B1 * | 11/2007 | Hammons, Jr. ... | H03M 13/2909 714/701 |
| 8,359,518 B2 * | 1/2013 | Rumbolt ............. | H03M 13/618 714/755 |
| 8,959,418 B1 * | 2/2015 | Pfister ............... | H03M 13/2921 714/785 |
| 9,059,735 B2 * | 6/2015 | Li ......................... | H03M 13/03 |
| 9,231,623 B1 * | 1/2016 | Kumar ................ | H03M 13/453 |
| 9,252,816 B1 * | 2/2016 | Steiner .............. | H03M 13/2918 |
| 9,397,706 B1 * | 7/2016 | Steiner ................ | H03M 13/152 |
| 10,063,261 B1 * | 8/2018 | Croxall, II ........ | H03M 13/2921 |
| 10,388,400 B2 * | 8/2019 | Kumar ................... | G11C 29/42 |
| 2011/0214039 A1 * | 9/2011 | Steiner .............. | H03M 13/2927 714/797 |

* cited by examiner

*Primary Examiner* — Steve N Nguyen
(74) *Attorney, Agent, or Firm* — Foley & Lardner LLP

(57) ABSTRACT

Various implementations described herein relate to systems and methods for decoding data stored in a non-volatile storage device, including determining error candidates and determining whether at least one first error candidate from the error candidates is found based on two of the component codes agreeing on a same error candidate. In addition, whether at least one second error candidate is found based on two of the component codes agreeing on a same error candidate is determined in response to implementing a suggested correction at one of the error candidates. Errors in the data are corrected based on at least one of whether the at least one first error candidate is found or whether the at least one second error candidate is found.

20 Claims, 12 Drawing Sheets

HARD DECODING METHODS IN DATA STORAGE DEVICES

TECHNICAL FIELD

The present disclosure relates generally to systems and methods for hard decoding for correcting errors in data storage devices, and in particular, in non-volatile memory devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP). Other causes for impairment can lead to complete erasure of a physical page, row, or block in a NAND flash memory device, in what is known as a block becoming a "bad" block and is no-longer readable. If impairments are not detected during programming, a encoding (e.g., a RAID encoding) may be needed to allow recovery of non-readable areas on the NAND flash memory device.

A code rate is defined by a ratio of information content (referred to as a "payload") of a codeword to an overall size of the codeword. For example, for a code that contains k bits and r redundancy bits, the code rate $R_c$ is defined by $$R_c = \frac{k}{k+r}.$$

Conventional encoding methods are not well suited to support codes having high code rates for both hard decoding and soft decoding. For example, conventional Low-Density Parity-Check (LDPC) codes that have high code rates (e.g., 0.9) have considerably long code length, resulting in complex and costly implementations.

SUMMARY

In some arrangements, systems, methods, and non-transitory processor-readable media relate to decoding data read from a non-volatile storage device, including determining error candidates for the data based on component codes, determining whether at least one first error candidate from the error candidates is found based on two of the component codes agreeing on a same error candidate, determining whether at least one second error candidate is found based on two of the component codes agreeing on a same error candidate in response to implementing a suggested correction at one of the error candidates, and correcting errors in the data based on at least one of whether the at least one first error candidate is found or whether the at least one second error candidate is found.

DETAILED DESCRIPTION

In some arrangements, a code construction as described herein is based on simple component codes (such as but not limited to, Bose-Chaudhuri-Hocquenghem (BCH) components) which can be implemented efficiently. The component codes implement iterative decoding. Therefore, the code construction has a more cost-effective implementation as compared to conventional codes (e.g., the LDPC codes) that have complex and costly implementations. This allows the code structure to be suitable for storage applications for flash memory devices (e.g., NAND flash memory devices and controllers thereof).

In some arrangements, the ECC structure uses multi-dimensional encoding. In multi-dimensional encoding, a stream of data is passed through a set of multiple component encoders (implemented or otherwise included by a controller) which together encode the full payload into a single codeword. BCH encoding can be performed by passing systematic data of the code through a shift register of a controller. Therefore, the systematic data can simply pass through the component encoders of the controller without being modified while the shift-register advances. After the systematic data being completely passed through the shift-register, the content of the shift register is the redundancy of the code and is appended to the data stream. The same characteristics are applicable to all component encoders in all dimensions. Multi-dimensional encoding can be obtained with product codes or symmetric product codes and may provide improved capabilities. Such structures create a product of component codes to obtain a full codeword. As such, the decoding process can include iterative decoding of the component codes.

Figure 1:
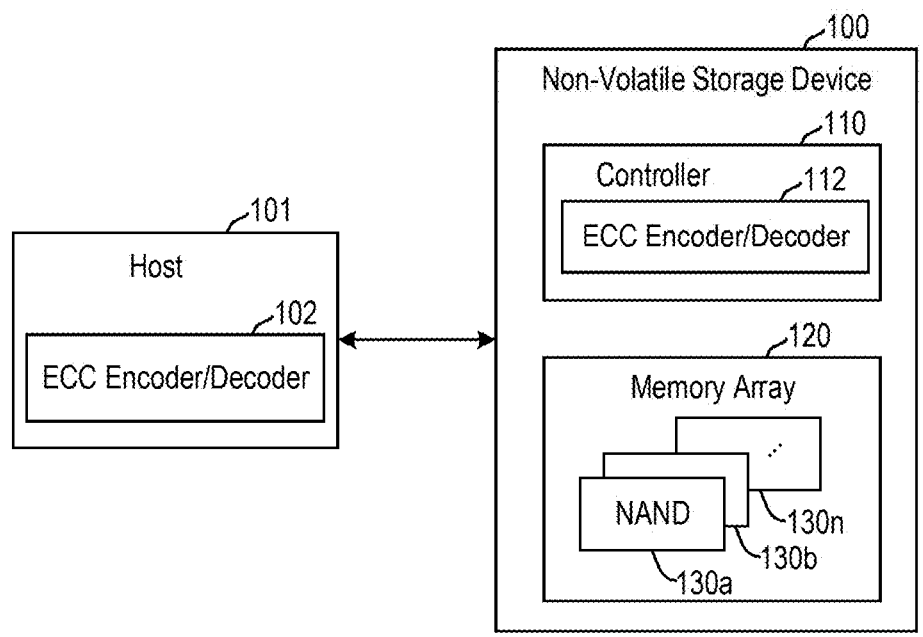
FIG. 1 shows a block diagram of examples of a system including a non-volatile storage device and a host, according to some implementations.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), ECC capabilities, and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some arrangements, one of the ECC encoder/decoder 102 or the ECC encoder/decoder 112 employs the hard decoding methods described herein. In some implementations, the ECC encoders of the ECC encoder/decoder 102 are configured to encode data (e.g. input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short codewords. In some arrangements, the HFPC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by:

$$t = (D_{min} - 1)/2, \quad (1)$$

where the $D_{min}$ of a linear block code is defined as the smallest Hamming distance between any pair of code vectors in the code. The number of redundancy bits r can be represented by:

$$r = Q \cdot (D_{min} - 1)/2, \quad (2)$$

where Q is a Galois field parameter for the BCH component code defined over $GF(2^Q)$. Given a code rate R and payload length K bits, a number of component codes needed can be determined by:

$$n = \left\lfloor K \cdot \frac{1-R}{r \cdot R} \right\rfloor; \text{ or} \quad (3)$$

$$n = \left\lfloor 2K \cdot \frac{1-R}{Q \cdot (D_{min} - 1) \cdot R} \right\rfloor. \quad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
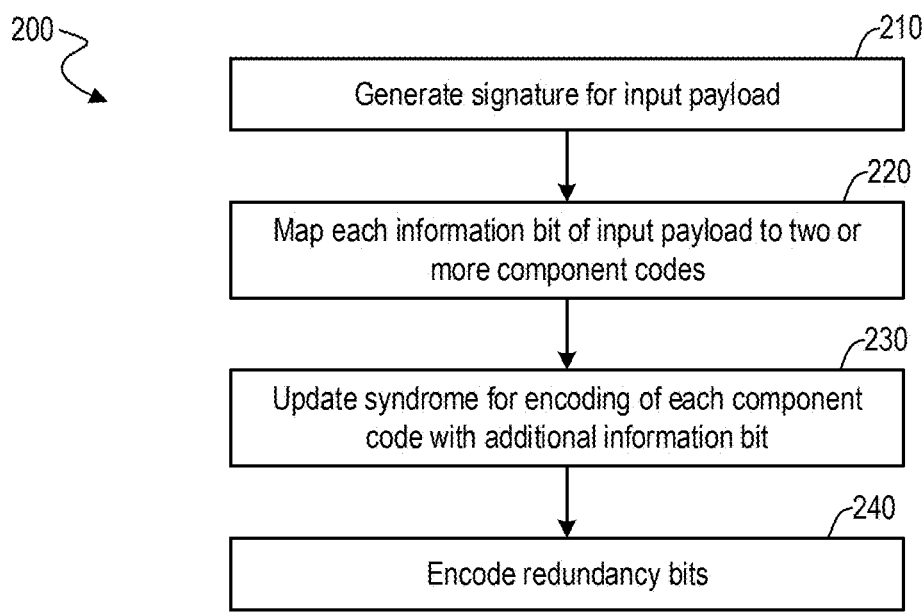
FIG. 2 is a process flow diagram illustrating an example encoding/decoding method, according to some implementations.

For example, FIG. 2 is a process flow diagram illustrating an example of an encoding method 200 according to some implementations. Referring to FIGS. 1-2, the method 200 encodes an input payload to obtain a corresponding ECC. The input payload includes information bits.

At 210, one or more encoders of the ECC encoder/decoder 102 or 112 generate a signature for the input payload. The signature can be used during decoding to check whether decoding is successful. In some examples, the signature can be generated by passing the information bits through a hash function. In some examples, the signature includes a Cyclic Redundancy Check-sum (CRC) generated from the information bits. In some examples, in addition to the CRC, the signature can include other indications generated from the input payload. The CRC can be generated to have a designated length.

The length of the CRC can be determined based on factors such as but not limited to, target misdetection probability of the codeword decoding, misdetection probability of decoding process (alone without the CRC), and so on. Misdetection probability of the codeword decoding refers to the probability of signaling-out a "decode success" despite the existence of decode errors. Misdetection probability of decoding process (alone without the CRC) refers to the probability of signaling-out a "decode failure" despite the absence of decode errors. Some level of confidence for decoding can be provided using the component codes zero syndromes, which in some cases may be sufficient to allow a zero-length CRC. Otherwise, the CRC can be used for a combined misdetection decision. For instance, longer length of the CRC corresponds to a low misdetection probability of the codeword decoding. On the other hand, shorter length of the CRC corresponds to high target misdetection probability of the codeword decoding.

At 220, the one or more encoders of the ECC encoder/decoder 102 or 112 map each information bit of the input payload to two or more component codes. In some examples, the bits corresponding to the signature (e.g., the CRC bits) can also encoded (e.g., each CRC bit can be mapped to one or more component codes in the arrangements in which the ECC is a regular HFPC). That is, the one or more encoders of the ECC encoder/decoder 102 or 112 implement a mapping function that maps each information bit of the input payload with corresponding component codes of the ECC. In the arrangements in which the ECC is a regular HFPC (e.g., FIG. 3), each information bit can be mapped to two component codes (e.g., i1 and i2). In the arrangements in which the ECC is an irregular HFPC, at least one information bit can be mapped to three or more component codes, thus creating an irregular encoding process.

Blocks 210 and 220 can be implemented simultaneously or in parallel in some examples. In other examples, blocks 210 and 220 can be implemented sequentially in any suitable order. The ECC code structure is composed of multiple component codes. Each component code can be, for example, a BCH code.

At 230, the one or more encoders of the ECC encoder/decoder 102 or 112 update a syndrome for encoding of each component code with an additional information bit. Thus, every component code encodes a portion of the input payload, depending on the mapping function executed at 220. A set of redundancy bits corresponding to the component codes are generated after all payload bits (including the information bits and the signature bits) are encoded per blocks 210-230.

At 240, the one or more encoders of the ECC encoder/decoder 102 or 112 encode the redundancy bits (in an additional encoding process) in some arrangements. That is, the redundancy bits can be mapped to additional component codes. For example, the encoding can be obtained by a similar set of component codes. The set of component codes may be a smaller set than a set of the payload encoding set, for example, for higher code rate. Every redundancy encoding component can receive separate redundancy input bits for encoding. As such, a parity of parity encoding is generated.

In some examples in which irregular codes are involved, 240 may not be performed (e.g., redundancy encoding may not be performed), such that the redundancy bits have degree-one protection while the systematic information bits have degree-two protection. The irregularity can also be obtained by performing a process of HFPC encoding with component codes having different correction capabilities and/or different lengths.

Figure 3:
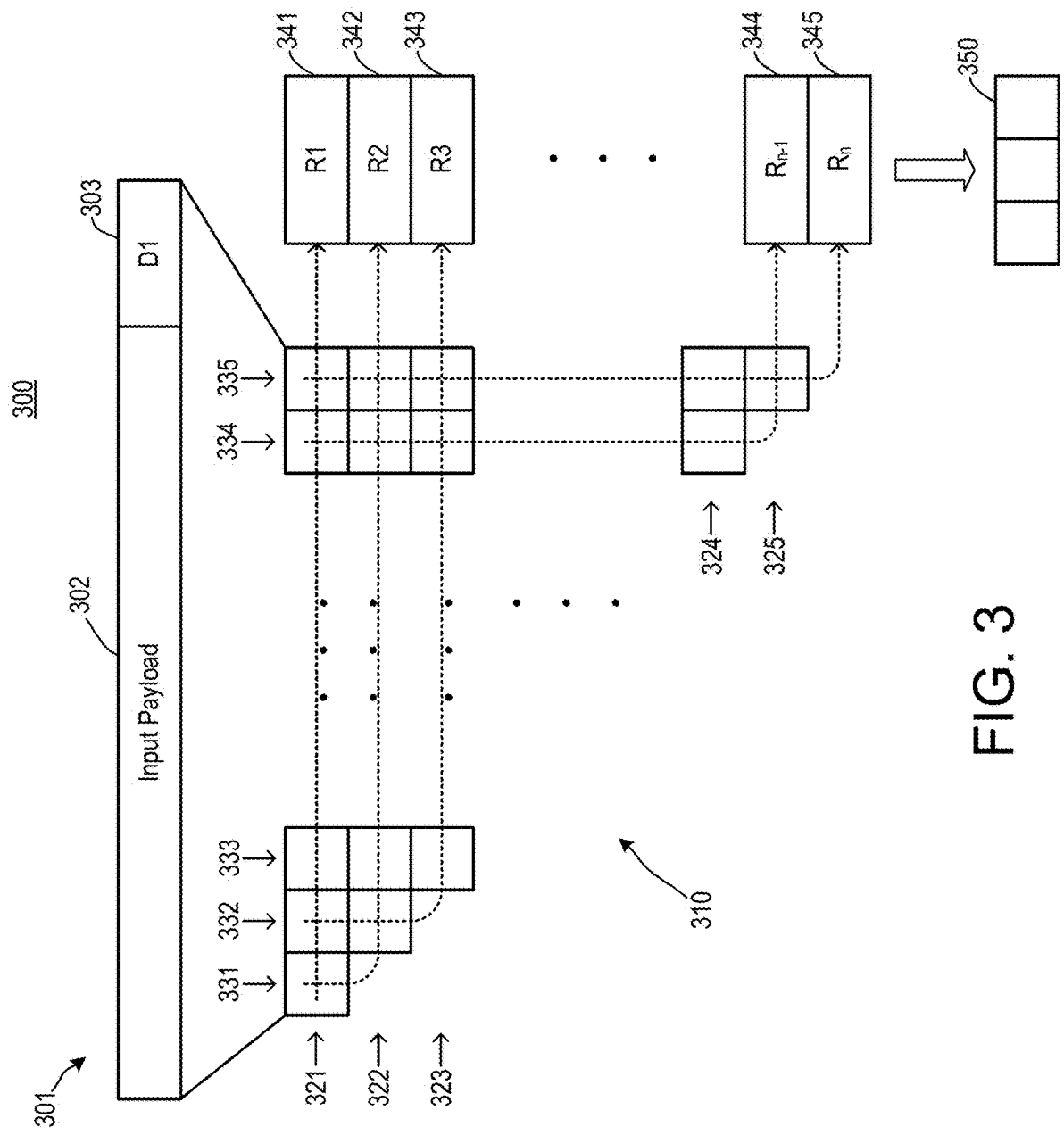
FIG. 3 is a diagram illustrating a mapping in an encoding process using a Half Folded-Product Code (HFPC) structure according to various implementations.

FIG. 3 is a diagram illustrating a mapping 300 in an encoding process using a HFPC structure according to various implementations. Referring to FIGS. 1-3, the mapping 300 corresponds to the HFPC encoding scheme and is an example implementation of block 220. The controller 110 (e.g., one or more ECC encoders of the ECC encoder/ decoder 112) or the host 101 (e.g., one or more ECC encoders of the ECC encoder/decoder 102) can include or can otherwise implement an HFPC interleaver configured to organize (e.g., interleave or map) input bits 301 into a form of a pseudo triangular matrix 310. The input bits 301 include input payload 302 and signature bit(s) D1 303 in some examples. The input payload 302 includes the information bits. In some examples, the input payload 302 includes information bits and redundancy bits introduced by the host 101 for RAID or erasure encoding (e.g. by the one or more ECC encoders of the ECC encoder/decoder 102). As described, an example of D1 303 is the extra CRC bits. The bits of D1 303 can also be referred to as "outer parity bits," given that CRC encoding can be viewed as an outer encoding process. The mapping from the input bits 301 to the pseudo triangular matrix 310 is maintained by the controller 110.

As shown, the pseudo triangular matrix 310 has an upper triangular form, which has rows 321-325 (with rows between rows 323 and 324 omitted for clarity) and column 331-335 (with columns between columns 333 and 334 omitted for clarity). The pseudo triangular matrix 310 is shown to have multiple blocks. Each block in the pseudo triangular matrix 310 includes or otherwise represents two or more bits of the input bits 301. The number of input bits per each block can be predetermined and equal for all the blocks of the pseudo triangular matrix 310. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 310 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits In some implementations, the input bits 301 are mapped to a block in the pseudo triangular matrix 310 consecutively (by any suitable order). For example, the rows 321-325, in that order or in a reverse order, can be filled by the input bits 301 consecutively block by block, from the left-most block of a row to a right-most block of a row, vice versa. In another example, the columns 331-335, in that order or in a reverse order, can be filled by the input bits 301 consecutively block by block, from the top-most block of a column to a bottom-most block of a row, vice versa. In some implementations, the input bits 301 are mapped to the pseudo triangular matrix 310 pseudo-randomly. In other implementations, the input bits 301 can be mapped to the pseudo triangular matrix 310 using another suitable mapping mechanism. In one arrangement, the mapping is a one to one mapping, where each bit of the input bits 301 is mapped to one bit of the pseudo triangular matrix 310 and the total number of bits in the pseudo triangular matrix 310 is equal to the number of input bits 301. In another arrangement, the mapping may be one to many, where each bit of the input bits 301 is mapped to one or more bits of the pseudo triangular matrix 310 and the total number of bits in the pseudo triangular matrix 310 is greater than the number of input bits 301.

As shown, the upper triangular form has a same number of columns and a same number of rows. In the upper triangular form, the row 321 contains the most bits out of all the rows in the pseudo triangular matrix 310. The row 322 has one less block than the row 321. The row 323 has one less block than the row 322, and so on. The row 324 has two blocks, and the row 325, being the lowest row, has one block. In other words, any row in the pseudo triangular matrix 310 (except for the row 321) has one block less than the row immediately above. Similarly, in the upper triangular form, the column 331, being the left-most column, has one block. The column 332 has one more block than the column 331. The column 333 has one more block than the column 332, and so on. The column 335, being the right-most column, has the most blocks out of the columns in the pseudo triangular matrix 310. In other words, any column in the pseudo triangular matrix 310 (except for the column 335) has one block less than the column immediately to its right.

Organizing or mapping the input bits 301 (which includes the bits of the input payload 302 and signature bit(s) D1 303) in the upper triangular form of the pseudo triangular matrix 310 allows every component code to be associated with bits in a row and a column that have the same size or nearly the same size in the manner described. For example, R1 341 represents redundancy bits corresponding to a first component code. R1 341 redundancy bits are obtained by encoding (e.g., folded component encoding) the input bits 301 in a first row (e.g., the bits in the row 321). R2 342 redundancy bits are obtained by encoding (e.g., via folded component encoding) the input bits 301 in a first column (e.g., the bits in the column 331) and the second row (e.g., the bits in the row 322). The number of total bits (e.g., the bits in the column 331 plus the bits in the row 322) encoded by R2 342 are the same as the number of total bits (e.g., the bits in the row 321) encoded by R1 341. R3 343 redundancy bits are obtained by encoding (e.g., via folded component encoding) the input bits 301 in a second column (e.g., the bits in the column 332) and the third row (e.g., the bits in the row 323). The number of total bits (e.g., the bits in the column 332 plus the bits in the row 323) encoded by R3 343 are the same as the number of total bits encoded by R2 342 (as well as the number of total bits encoded by R1 341). This process continues to obtain the last redundancy bits Rn 345, which encodes (e.g., via folded component encoding) the input bits 301 in the last column (e.g., the bits in the column 335). Thus, each component code encodes a row and a column in the pseudo triangular matrix 310, providing folded component encoding. An example of the folded component encoding is folded BCH encoding.

In other words, according to the mapping 300, the input bits 301 are mapped to the component codes of the ECC and are encoded as the mapped component codes. For example, the encoding process organizes or maps the input bits 301 into a matrix (e.g., the pseudo triangular matrix form), and performs folded BCH encoding for every component code. Each of the input bits 301 is encoded by two component codes. Each component code intersects with all other component codes. For component codes that encode the input bits 301, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 343 redundancy bits are also encoded by other component codes corresponding to R1 341, R2 342, and R4-Rn 345. The bits at intersection of the row 321 and the column 332 are also encoded by the component code corresponding to R1 341; the bits at the intersection of the row 322 and the column 332 are also encoded by the component code corresponding to R2 342; the bits at the intersection of the row 323 and the column 334 are also encoded by the component code corresponding to Rn-1 344; the bits at the intersection of the row 323 and the column 335 are also encoded by the component code corresponding to Rn 345. Each block of bits encoded by any of the component code (e.g., the component code corresponding to the R3 343) is encoded by that component code (e.g., the component code corresponding to the R3 343) and no more than another one of the component codes, hence in a non-overlapping manner. As such, every component code is mutually dependent on all other component codes. The component codes together provide the encoding of each of the input bits 301 using two component codes. The component codes have the same code rate given that each component code encodes a same number of bits.

In some implementations, parity bits can be generated via parity encoding. For example, folded parity encoding can be used to encode at least a portion of each of R1 341-Rn 345 into another component code (e.g., a folded product code 350, which is a set of packets). The folded product code 350 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 341-Rn 345 is encoded to obtain the folded product code 350. This is because only the encoded versions of the input bits 301 (e.g., the input payload 302) needs to be decoded—decoding all of the redundancy bits R1 341-Rn 345 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIG. 3, an additional encoding process can be applied to some of the input bits 301 by encoding those bits with a different set of component codes. In some examples, the irregularity of the encoding process is caused by some of the input bits 301 being encoded by more than two component codes while other bits of the input bits 301 are encoded by two component codes, creating an unequal error protection of the bits within the codeword and resulting in improved correction capabilities (as applied to iterative decoding).

The redundancy bits R1 341-Rn-m 345 generated from the HFPC encoding process described with respect to FIG. 3 can be encoded by another, separate set of component codes used to encode all or a subset of these redundancy bits by another set of component codes. This forms a folded product code encoding over the redundancy bits R1 341-Rn-m 345, which, together with the information bits encoding, results in a low complexity encoding process.

As shown, the bits for each component code depend on the bits for another component code during decoding in the ECC structure corresponding to the mapping 300.

For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes.

In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

Figure 4:
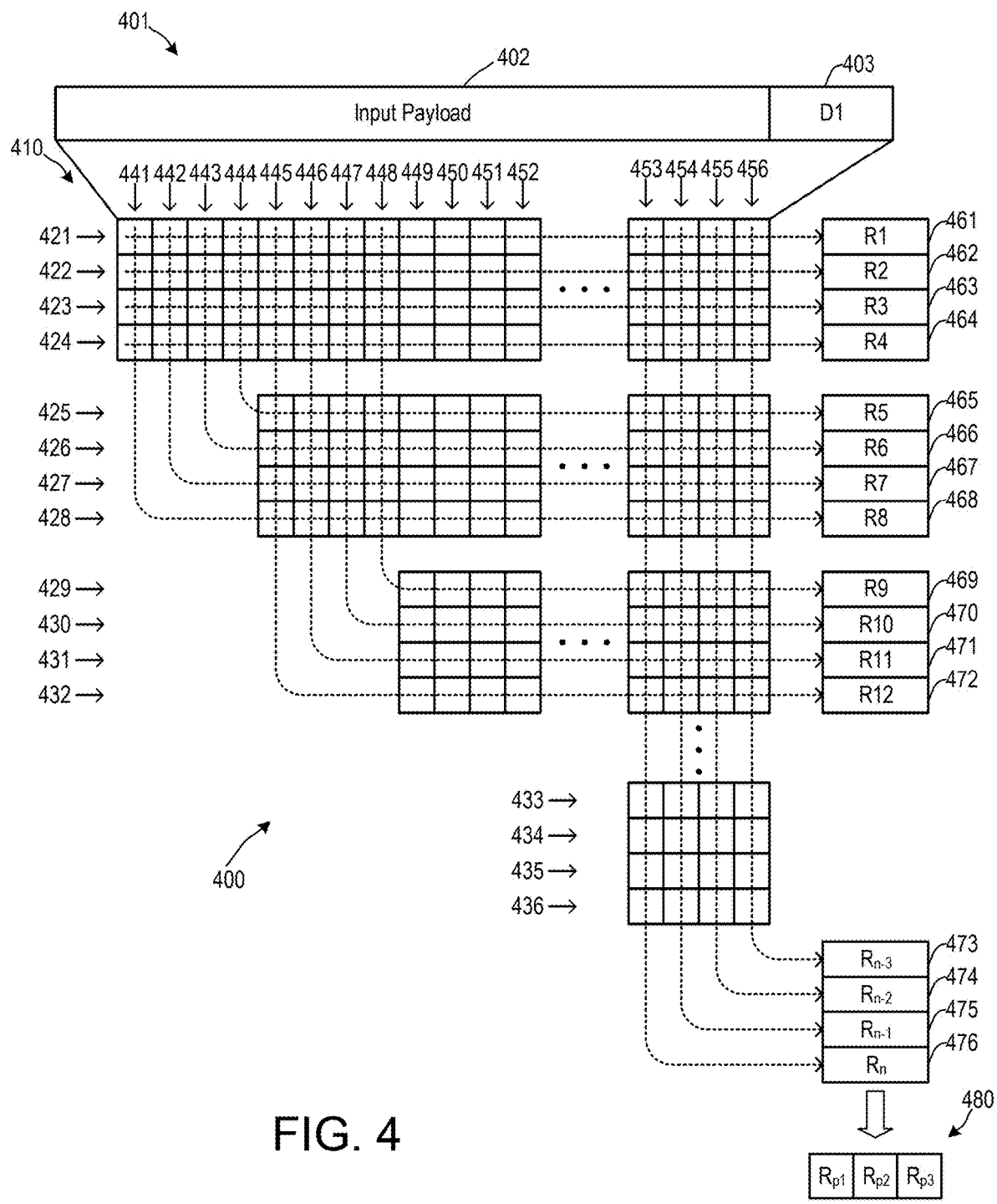
FIG. 4 is a diagram illustrating a mapping in an encoding process using a group HFPC structure according to various implementations.

In that regard, FIG. 4 is a diagram illustrating a mapping 400 in an encoding process using a group HFPC structure according to various implementations. Referring to FIGS. 1-4, the mapping 400 corresponds to the group HFPC encoding scheme and is an example implementation of block 220. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 401 into a form of a pseudo triangular matrix 410. The input bits 401 includes input payload 402 and signature bit(s) D1 403 in some examples. The input payload 402 includes the information bits. As described, an example of D1 403 is the extra CRC bits (outer parity bits). The mapping from the input bits 401 to the pseudo triangular matrix 410 is maintained by the controller 110.

As shown, the pseudo triangular matrix 410 has an upper triangular form, which has rows 421-436 (with rows between rows 432 and 433 omitted for clarity) and columns 441-456 (with columns between columns 452 and 453 omitted for clarity). The pseudo triangular matrix 410 is shown to have multiple blocks. Each block in the pseudo triangular matrix 410 includes or otherwise represents two or more bits of the input bits 401. The number of input bits per each block can be predetermined and equal for all the blocks of the pseudo triangular matrix 410. The disclosed implementations allow intersection of two or more common bits for any pair of component codes.

In some implementations, the input bits 401 are mapped to blocks in the pseudo triangular matrix 410 consecutively (by any suitable order). For example, the rows 421-436, in that order or in a reverse order, can be filled by the input bits 401 consecutively block-by-block, from the left-most block of a row to a right-most block of a row, or vice versa. In another example, the columns 441-456, in that order or in a reverse order, can be filled by the input bits 401 consecutively block-by-block, from the top-most block of a column to a bottom-most block of a row, or vice versa. In some implementations, the input bits 401 are mapped to the pseudo triangular matrix 410 pseudo-randomly. In other implementations, the input bits 401 can be mapped to the pseudo triangular matrix 410 using another suitable mapping mechanism.

The blocks, rows, and columns in the pseudo triangular matrix 410 can be grouped together. For example, the pseudo triangular matrix 410 includes a first group of columns 441-444, a second group of columns 445-448, a third group of columns 449-452, . . . , and another group of columns 453-456. The pseudo triangular matrix 410 includes a first group of rows 421-424, a second group of rows 425-428, a third group of rows 429-432, . . . , and another group of rows 433-436. Thus, the HFPC structure is divided into groups of 4 component codes. Every 4 component codes are encoded according to HFPC guidelines. Although 4 component code groups (e.g., 4 rows/columns) are shown in FIG. 4, any number (e.g., 2, 3, 6, 8, 10, 12, 16, and so on) of component codes can be grouped together.

As shown, the upper triangular form has a same number of columns and a same number of rows. The rows (e.g., the rows 421-424) or columns (e.g., the columns 441-444) in a same component code group have a same number of blocks and therefore have a same number of bits. In the upper triangular form, the rows 421-424 contain the most bits out of all the rows in the pseudo triangular matrix 410. Each of the rows 425-428 has one less group of blocks (4 blocks, corresponding to the group of columns 441-444) than any of the rows 421-424. Each of the rows 429-432 has one less group of blocks (4 blocks, corresponding to the group of columns 445-448) than any of the rows 425-428, and so on. Each of the rows 433-436, being the lowest row, has a group of blocks (e.g., 4 blocks). In other words, any row in the pseudo triangular matrix 410 (except for the rows 421-424) has 4 blocks less than a row of a group immediately above. Similarly, in the upper triangular form, each of the columns 441-444, being one of the left-most columns, has a group of blocks (e.g., 4 blocks). Each of the columns 445-448 has one more group of blocks (4 blocks, corresponding to the group of rows 425-428) than any of the columns 441-444. Each of the columns 449-452 has one more group of blocks (4 blocks, corresponding to the group of rows 429-432) than any of the columns 445-448, and so on. Each of the columns 453-456, being the right-most columns, has the most number of blocks. In other words, any column in the pseudo triangular matrix 410 (except for the columns 453-456) has 4 blocks less than a column of a group immediately to the right.

Organizing or mapping the input bits 401 in the upper triangular form of the pseudo triangular matrix 410 allows every component code to be associated with bits in a row and a column that have the same size or nearly the same size in the manner described. The component codes within a same group encode separate sets of the input bits 401 and are independent of each other.

R1 461-R4 464 are redundancy bits determined based on a same group of component codes. R1 461 represents redundancy bits corresponding to a first component code and are obtained by encoding (e.g., folded component encoding) the input bits 401 in a first row (e.g., the bits in the row 421). R2 462, R3 463, and R4 464 represent redundancy bits corresponding to additional component codes and are obtained by encoding (e.g., folded component encoding) the input bits 401 in the bits in the rows 422, 423, and 423, respectively. The bits used to determine each of R1 461-R4 464 do not overlap, and thus R1 461-R4 464 are independently determined.

R5 465, R6 466, R7 467, and R8 468 represent redundancy bits corresponding to additional component codes and are obtained by encoding (e.g., folded component encoding) the input bits 401 in the bits in the column 444 and row 425, in the column 443 and row 426, in the column 442 and row 427, and in the column 441 and row 428, respectively. The bits used to determine each of R5 465-R8 468 do not overlap, and thus R5 465-R8 468 are independently determined.

R9 469, R10 470, R11 471, and R12 472 represent redundancy bits corresponding to additional component codes and are obtained by encoding (e.g., folded component encoding) the input bits 401 in the bits in the column 448 and row 429, in the column 447 and row 430, in the column 446 and row 431, and in the column 445 and row 432, respectively. The bits used to determine each of R9 469-R12 472 do not overlap, and thus R9 469-R12 472 are independently determined.

This process continues until Rn-3 473, Rn-2 474, Rn-1 475, and Rn 476 are determined. Rn-3 473, Rn-2 474, Rn-1 475, and Rn 476 represent redundancy bits corresponding to additional component codes and are obtained by encoding (e.g., folded component encoding) the input bits 401 in the bits in the column 456, in the column 455, in the column 454, and in the column 453, respectively. The bits used to determine each of Rn-3 473, Rn-2 474, Rn-1 475, and Rn 476 do not overlap, and thus Rn-3 473, Rn-2 474, Rn-1 475, and Rn 476 are independently determined. An example of the folded component encoding is folded BCH encoding.

In the special case that the component codes are divided into two groups of independent component codes, the resulting coding scheme degenerates to a folded product code.

According to the mapping 400, the input bits 401 are mapped to the component codes of the ECC and are encoded as the mapped component codes. For example, the encoding process organizes or maps the input bits 401 in a matrix (e.g., a pseudo triangular matrix form), and performs folded BCH encoding for every component code. Each of the input bits 401 is encoded by two component codes of different component code groups. Thus, any component code intersects with all other component codes that are in the same group as the group to which that component code belongs. For component codes that encode the input bits 401, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 469 redundancy bits are also encoded by other component codes corresponding to R1 461-R8 468 and R11-Rn 476 that are not in the group in which the component code corresponding to R9 469 redundancy bits belongs. Each block of bits encoded by any of the component code (e.g., the component code corresponding to the R9 469) is encoded by that component code (e.g., the component code corresponding to the R9 469) and no more than another one of the component codes, hence in a non-overlapping manner. As such, every component code is mutually dependent on all other component codes that are not within the same group. The component codes together provide the encoding of each input bits 401 using two component codes.

In some implementations, parity bits can be generated via parity encoding. For example, folded parity encoding can be used to encode at least a portion of each of R1 461-Rn 476 into another component code (e.g., a folded product code 480, which is a set of packets). The folded product code 480 (e.g., having Rp1-Rp3) is the parity bits. This method of generating the parity bits can be efficient for obtaining simple hardware encoding implementations of HFPC, as the method can be iteratively decoded using various methods of hard or soft decoding.

With regard to hard decoding HFPC as described herein, a HFPC iterative hard decoder can be employed. In a hard decoding process performed by the HFPC iterative hard decoder, a basic sub-iteration includes attempting to decode all component codes. Hard decoding, also known as hard decision decoding, is the process that operates on the bits of a code which can have a fixed set of values (such as a 1 or a 0 for a binary code). In contrast, soft decoding, or soft decision decoding, is the process which operates on the bits of a code which can have a range of values in-between, along with an indication as to the reliability or likelihood of the value being correct. The component codes can include BCH codes which correct a few errors (e.g. t≤4 per BCH component code), thus the decoding per component code can be implemented efficiently in hardware while obtaining high decoding reliability via iterative decoding. In NAND flash memory devices, the read performance depends on decoder latency. Therefore high-speed decoding is needed for high read performance. When the number of errors is not too high, it is usually possible to complete successful decoding using iterative fast decoding only, without advanced and/or intersections decoding, and at extremely low latency.

In response to determining that inners decoding in a sub-iteration is not successful, other types of multi-dimensional decoding can be attempted. Some advanced types of decoding for BCH components includes (t−1) limited corrections per BCH component. This stage is also referred to as the "(t−1) decoding" phase and is aimed at minimizing the false corrections by performing BCH corrections which have lower false correction probability. It is used with hard decoding, where iterative hard decoding includes, for example, bounded distance decoding of each component code for a BCH component.

In response to determining that the BCH components have a decoding capability of t≤4, a direct solution from the syndromes can be applied, enabling efficient hardware implementation, with high decoding throughput.

A simplified approach includes performing a (t−1) decoding phase, with correction of up to one error less than the BCH code correction capability t. For a BCH component with $D_{min}$, the correction capability is shown in expression (1). To increase probability of reliable correction, the decoder performs iterations in which only less than t errors are corrected. Every component code has a code spectrum, which can be utilized for this purpose. For instance, a probability distribution P(n, e) is defined where n (e.g., 0≤n≤t) is the number of false error detection after BCH decoding, and e is the number of input errors (e.g., e>t). After decoding a BCH component code with e>t, additional errors may exist according to:

$$P_n(m) = \sum_{e=t+1}^{N} P(m, e), \quad (5)$$

where N is a codeword length (including parity bits) of the component code. Thus, limiting to m corrections per component code can change every iteration with a gradually increasing false correction probability.

Limiting the number of errors to t−1 and multi-dimensional iterative decoding can each be carried out for $M_0 \geq 0$ and $M_1 \geq 0$ iterations, respectively. Whereas $M_0=0$, no (t−1) decoding iterations occur. Such configuration is valid for fast decoding.

In response to determining that the decoding is not successful up to this point, other more advanced methods can be employed. Given that multi-dimensional codes are used, every input bit is encoded by multiple component codes. Therefore, using intersections decoding at this point can be useful. In an example, responsive to determining that there are still some unsolved decoder components, and there is no further progress of bounded distance iterative hard iterative decoding, intersections decoding can be employed.

Unsolved intersection bits are defined as information bits that belong to distinct component codes, all of which are unsolved (e.g., have misCorrection=1). The more component codes used, the smaller the bit-set of intersection between the component codes is. In HFPC codes disclosed herein, the intersections size is minimal on a regular code by construction, given that every component bit is cross-encoded by all other component codes. Such properties of the HFPC create smallest intersections sizes and enable low-complexity enumeration for intersections decoding. As described, the intersection bit-set length may change based on the payload size of component codes on a same dimension.

In intersections decoding, bit-sets (obtained by intersections of component codes with non-zero (unsolved) syndromes) are mapped. If needed, the intersections bit-sets list size is limited. A number of bits for enumeration can be determined. The enumeration complexity is bounded by $$\binom{L_b}{N_b},$$

where $N_b$ is a number of bits that are simultaneously flipped every intersection's decoding, and $L_b$ is a number of bits in a single bit-set intersection. For every selected intersection-set enumerated over the intersection bits (every time another $N_b$ bits are flipped), decoding of the corresponding component codes is attempted on the selected dimensions. This enables correcting t+Nb errors of a single component code. Inversion of $N_b$ bits are accepted as valid solutions (of an intersection-set) if misCorrection=0 after decoding for a number of component codes exceeding some threshold (with respect to a single component, a zero threshold).

Usually, after the intersections decoding flow makes progress by providing the decoding with valid solution candidates, the decoding flow of the sub-iterations may continue, and achieve more decoding progress over the iterative decoding sub-iterations.

The arrangements disclosed herein relate to hard decoding methods that improve endurance and average read performance for the NAND flash memory devices 130a-130n by enabling correction of high raw-BER at high performance. Such hard decoding methods are suitable for general product codes, where iterative decoding of multiple small component codes is employed. Furthermore, such hard decoding methods are low-complexity while capable of reducing the component code's miss correction probability within the iterative decoding by applying look-ahead methods and thus obtaining a higher decoding capability. In some examples, the hard decoding methods can be implemented on the controller 110 (e.g., performed by the hardware and/or firmware of the controller 110, including but not limited to the ECC encoder/decoder 112). In some examples, the hard decoding methods can be implemented on the host 101 (e.g., performed by the software of the host 101, including but not limited to the ECC encoder/decoder 102).

Figure 5:
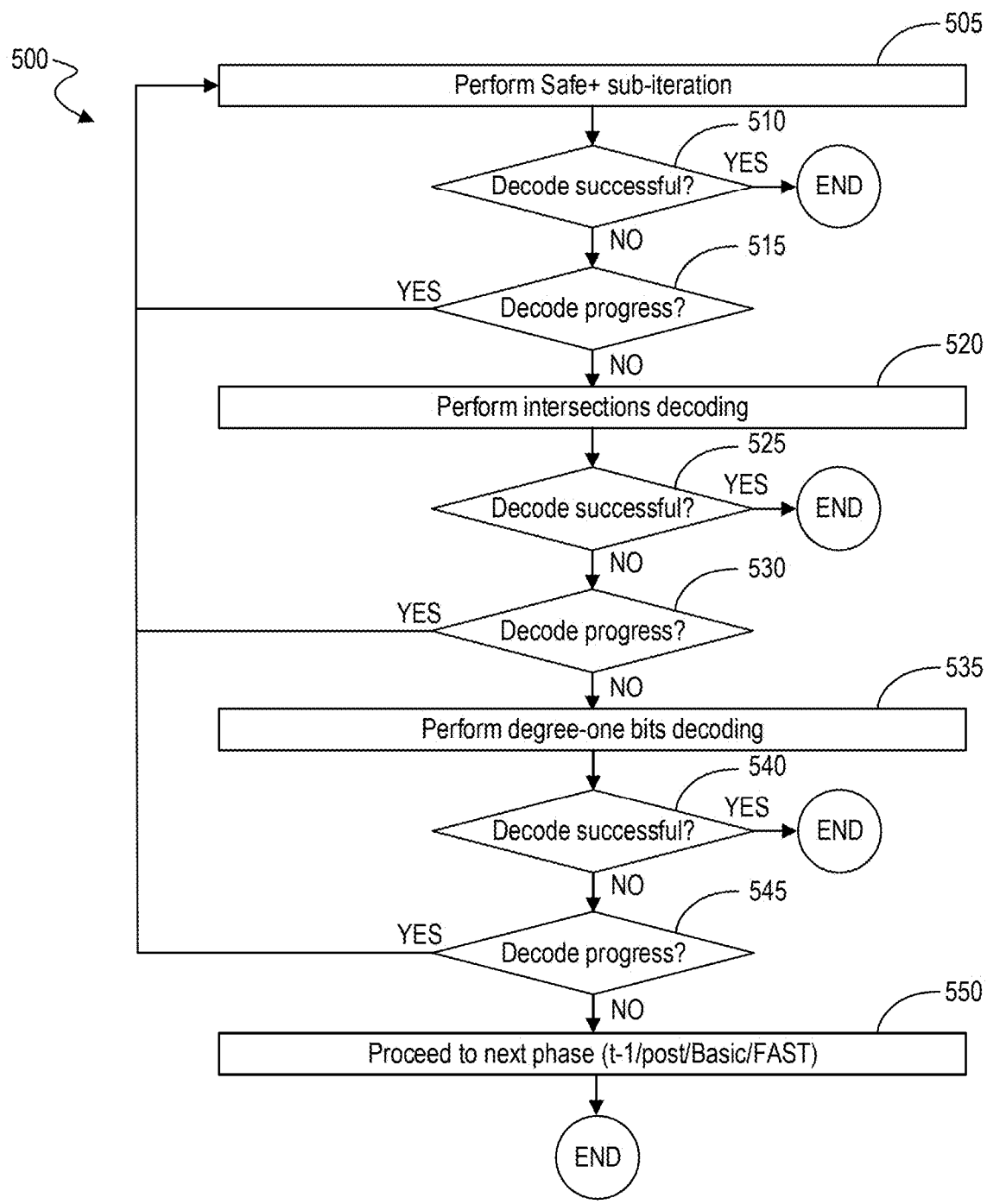
FIG. 5 is a process flow diagram illustrating an example hard decoding method, according to some implementations.

FIG. 5 is a process flow diagram illustrating an example hard decoding method 500, according to some implementations. Referring to FIGS. 1-5, the hard decoding method 500 can be performed by the decoder of the ECC encoder/decoder 102 or the decoder of the ECC encoder/decoder 112, referred to as the "decoder." The hard decoding method 500 employs a look-ahead algorithm and includes Safe Look-Ahead (SLA) iterations. For example, the hard decoding method 500 includes multiple "Safe+ sub-iteration" which includes of SLA operations. The SLA operations allow the hard decoding method 500 to achieve improved reliability. In response to determining that no decoding progress is made with a Safe+ sub-iteration, the decoder can perform intersections decoding. In response to determining that no decoding process is made with intersections decoding, the decoder can perform degree-one decoding.

At 505, the decoder performs a Safe+ sub-iteration. The Safe+ sub-iteration corresponds to a method by which candidates with minimal false correction probabilities are selected. The Safe+ sub-iteration includes various SLA operations. An example implementation of 505 is disclosed in further detail in FIGS. 6 and 7. In each Safe+ sub-iteration, the decoder attempts to decode all component codes independently.

At 510, the decoder determines whether decode is successful using the safe+ sub-iteration. The decoder can determine whether decode is successful by checking the signature bit. In response to determining that decode is successful (510:YES), the method 500 ends.

On the other hand, in response to determining that decode is not successful (510:NO), the decoder determines, at 515, whether decode progress has been made. Decode progress is deemed to be made in response to determining that at least one additional or different component code has been successfully decoded and solved in the current iteration 505, or in response to determining that at least one additional or different error candidate has been generated in the current iteration 505. In response to determining that decode progress has been made (515:YES), the method 500 returns to 505 for the next iteration.

On the other hand, in response to determining that decode progress has not been made (515:NO), the decoder performs intersections decoding at 520. Unsolved intersection bits are defined as information bits that belong to distinct component codes, all of which are unsolved (e.g., have misCorrection=1). The more component codes used, the smaller the bit-set of intersection between the component codes is. In HFPC codes disclosed herein, the intersections size is minimal on a regular code by construction, given that every component bit is cross-encoded by all other component codes. Such properties of the HFPC create smallest intersections sizes and enable low-complexity enumeration for intersections decoding. As described, the intersection bit-set length may change based on the payload size of component codes on a same dimension.

In intersections decoding, first, bit-sets (obtained by intersections of component codes with non-zero (unsolved) syndromes) are mapped. Second, if needed, the intersections bit-sets list size is limited. Third, a number of bits for enumeration can be determined. The enumeration complexity is bounded by $$\binom{L_b}{N_b},$$

where $N_b$ is a number of bits that are simultaneously flipped every intersection's decoding, and $L_b$ is a number of bits in a single bit-set intersection. Fourth, for every selected intersection-set enumerated over the intersection bits (every time another $N_b$ bits are flipped), decoding of the corresponding component codes is attempted on the selected dimensions. This enables correcting t+Nb errors of a single component code. Fifth, inversion of $N_b$ bits are accepted as valid solutions (of an intersection-set) if misCorrection=0 after decoding for a number of component codes exceeding some threshold (with respect to a single component, a zero threshold).

At 525, the decoder determines whether decode is successful using the intersections decoding. In response to determining that decode is successful (525:YES), the method 500 ends.

On the other hand, in response to determining that decode is not successful (525:NO), the decoder determines, at 530, whether decode progress has been made using the intersections decoding. In response to determining that decode progress has been made (530:YES), the method 500 returns to 505 for the next iteration.

On the other hand, in response to determining that decode progress has not been made (530:NO), degree-one bits decoding is performed in some examples in which irregular codes are used, at 535. For example, the decoder or a different dedicated decoder attempts to decode bits (e.g., the redundancy bits) which have degree-one encoding protection.

At 540, the decoder determines whether decode is successful using the degree-one bits decoding. In response to determining that decode is successful (540:YES), the method 500 ends.

On the other hand, in response to determining that decode is not successful (540:NO), the decoder determines, at 545, whether decode progress has been made using the degree-one bits decoding. In response to determining that decode progress has been made (545:YES), the method 500 returns to 505 for the next iteration.

On the other hand, in response to determining that decode progress has not been made (545:NO), the decoder process to next-phase decoding at 550, including but not limited to, t−1 decoding, post decoding, basic decoding, and FAST decoding. In case the next phase fails, the method 500 ends.

Figure 6:
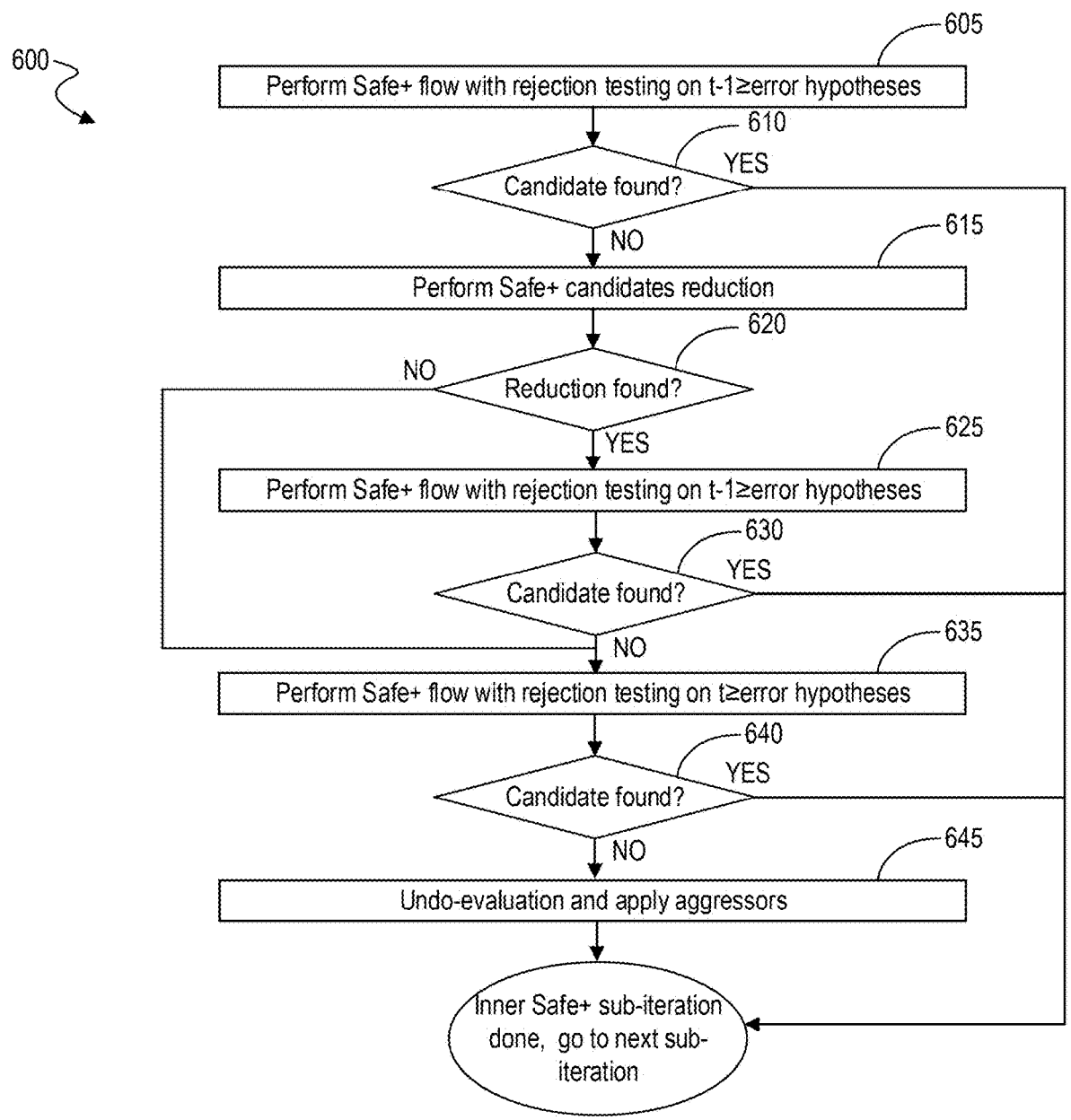
FIG. 6 is a process flow diagram illustrating an example method for determining candidates with minimal false correction probabilities, according to some implementations.

FIG. 6 is a process flow diagram illustrating an example method 600 for determining candidates with minimal false correction probabilities, according to some implementations. Referring to FIGS. 1-6, the method 600 (also referred to as a Safe+ sub-iteration) is an example implementation of 505. The method 600 includes various testing stages (referred to as "Safe+ flow with rejection") applied on solution candidates for obtaining a decision on which candidates are to be accepted. The Safe+ flow with rejection is described in further detail in FIG. 7.

For example, at 605, the decoder performs Safe+ flow with rejection. Examples of the Safe+ flow with rejection include but are not limited to, the method 700. In performing the Safe+ flow with rejection, each component code is configured to generated a number of candidate errors that is less than or equal to t−1, which is one less than the BCH code correction capability t. At 610, the decoder determines whether at least one candidate is found in 605. In response to determining that at least one candidate is found (610: YES) (e.g., 710:YES, 720:YES, 735:YES), the inner Safe+ sub-iteration ends and the method 500 proceeds to a next Safe+ sub-iteration at 505 (the method 600). Those candidates (strong-accept solutions) are accepted.

On the other hand, in response to determining that at least one candidate is not found (610:NO) (e.g., 835:NO), the decoder performs Safe+ candidates reduction, at 615. In the example in which all candidate errors generated at 605 are marked for rejection (e.g., no strong-accept solutions are found in the method 700), the decoder re-evaluates each error candidate by evaluating a number of aggressors for each error candidate. An aggressor is defined as a component code having a solution that changes a solution of a target component code. In other words, an aggressor is a component code that generates at least one error candidate that is different from any of the error candidates generated by a target component code for the same bits. If a target component code has a number of aggressors exceeding a predetermined threshold, the error candidates of the target component code are removed from the list of error candidates as a reduction, given that those error candidates are likely to be false corrections.

Thus, in response to any reductions being found (620: YES), at 625, the decoder again performs Safe+ flow with rejection, with each component code being configured to generated a number of candidate errors that is less than or equal to t−1, and with the reduction applied. That is, the decoder performs the method 700 again without taking into account one or more component codes having a number of aggressors above the predetermined threshold, thus removing error candidates that are likely false corrections from consideration. On the other hand, in response to determining that reduction is not found (620:NO), the method 600 proceeds to 635.

At 630, the decoder determines whether at least one candidate. In response to determining that at least one candidate is found (630:YES) (e.g., 710:YES, 720:YES, 735:YES), the inner Safe+ sub-iteration ends and the method 500 proceeds to a next Safe+ sub-iteration at 505 (the method 600). Those candidates (strong-accept solutions) are accepted.

On the other hand, in response to determining that at least one candidate is not found (630:NO) (e.g., 835:NO), the decoder performs Safe+ flow with rejection, with each component code being configured to generated a number of candidate errors that is less than or equal to t. That is, the decoder performs the method 700 again with each component code generating up to the decode capabilities t of the component code. Though less reliable than 605 and 625, performs the method 700 with each component code generating up to the decode capabilities t allows more error candidates to be determined.

At 640, the decoder determines whether at least one candidate. In response to determining that at least one candidate is found (640:YES) (e.g., 710:YES, 720:YES, 735:YES), the inner Safe+ sub-iteration ends and the method 500 proceeds to a next Safe+ sub-iteration at 505 (the method 600). Those candidates (strong-accept solutions) are accepted.

On the other hand, in response to determining that at least one candidate is not found (640:NO) (e.g., 835:NO), the decoder performs undo-evaluation and apply aggressors, at 645. In the example in which no candidate (strong-accept solution) is found (e.g., 610:NO, 630:NO, and 640:NO), the decoder rejects all error candidates in the list of error candidates. In addition, the decoder can further evaluate or, in some cases, revert error candidates that have already been implemented previously (e.g., in a previous Safe+ sub-iteration). For example, the decoder can compute a number of aggressors for each component code having previously corrected error candidates. In response to determining that the number of aggressor component codes exceed a predetermined threshold, the decoder marks the corresponding component code for undo, and the error candidates determined using that component code is reverted. The decoder can implement suggested correction of error candidates determined using the aggressor component codes, thus enabling further progress in the Safe+ flow. After 645, the inner Safe+ sub-iteration ends and the method 500 proceeds to a next Safe+ sub-iteration at 505 (the method 600). Alternatively, after 645, the inner Safe+ sub-iteration ends and the method 500 proceeds to intersections decoding at 520.

Figure 7:
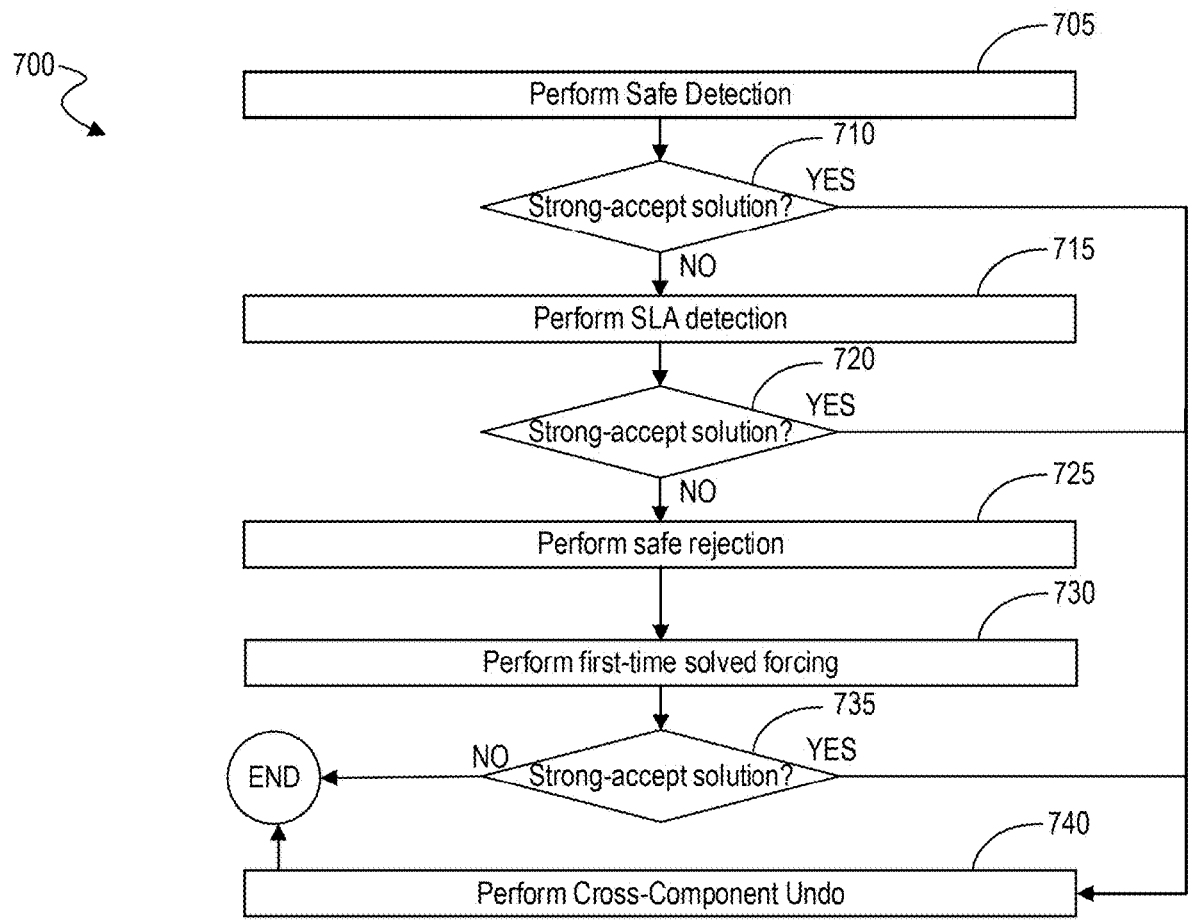
FIG. 7 is a process flow diagram illustrating an example method for determining candidates, according to some implementations.

FIG. 7 is a process flow diagram illustrating an example method for determining candidates, according to some implementations. Referring to FIGS. 1-7, the method 700 can be performed by the decoder of the ECC encoder/decoder 102 or the decoder of the ECC encoder/decoder 112, referred to as the "decoder." The method 700 (also referred to as Safe+ flow with rejection) is an example implementation of 605, 625, and 635. Generally, in the method 700, different thresholds or different input candidates are applied to obtained a useful output list of candidates for solutions implementation.

At 705, the decoder performs safe detection. In a detection stage, the decoder attempts to solve each of the component codes separately and saves any suggested candidate or solution into memory. None of the suggested solutions is actually implemented at this point, as otherwise implementing any suggested solution may affect solutions of other component codes. In the detection phase, each component code is tested for new solutions. The suggested solutions are denoted by:

$$\{x_i\}_{i \in G}, \tag{6}$$

where G is a group of indices each corresponding to a respective one of the component codes that has a valid solution during detection. Each $x_i$ is an error vector candidate generated by solving during the detection phase.

Once the error candidates are ready, the decoder determines whether strong-accept solutions are found, at 710. For example, the decoder determines whether strong-accept solutions are found by searching for identical error candidates. In some examples, given that all or almost all codeword bits are protected by two component codes, if two component codes have a common/identical error candidate, the solution corresponding to the common error candidate is expected to have a higher reliability of being a true solution (and not a false correction). Therefore, such solutions are considered as "strong-accept" solutions. The decoder marks the solved component codes with a high reliability mark (e.g., a "forcing" state).

Figure 8:
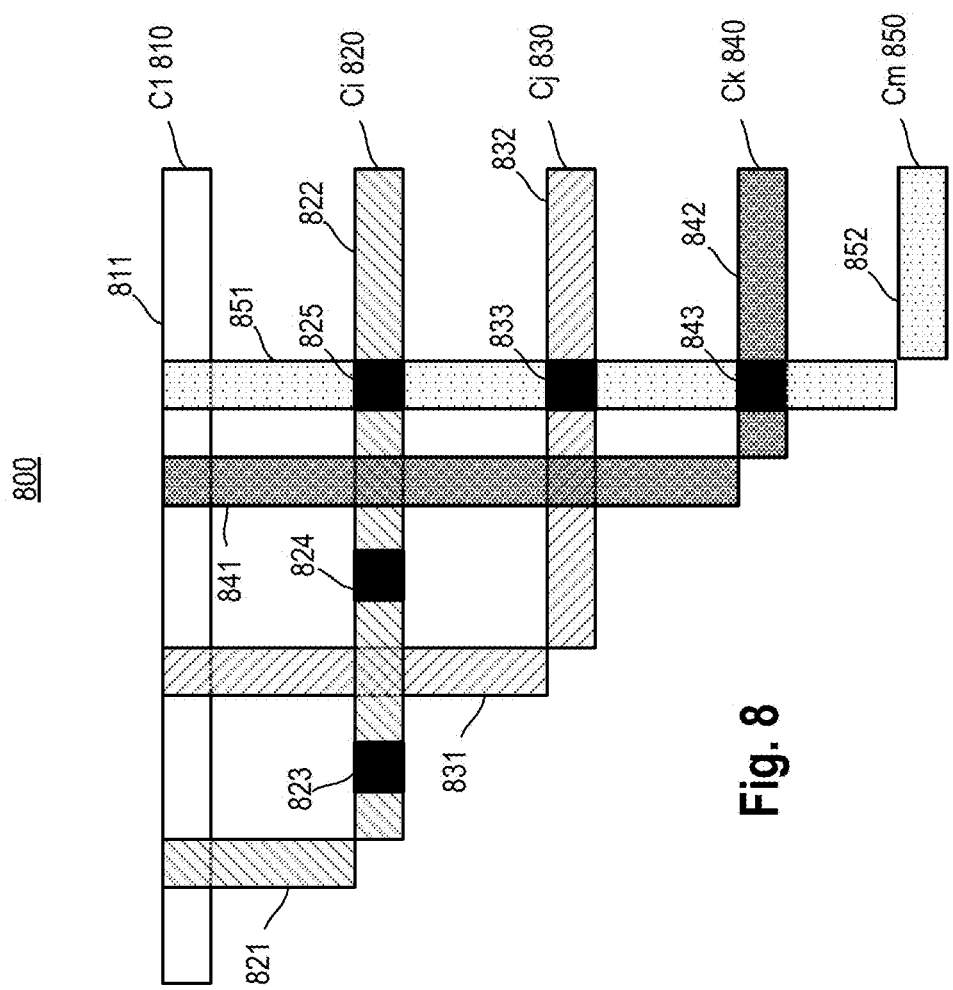
FIG. 8 is a diagram illustrating a decoding scenario in which two component codes indicate suggested corrections that are in agreement, according to various implementations.

FIG. 8 is presented to illustrate strong-accept solutions determined during safe detection, at 705. FIG. 8 is a diagram illustrating a decoding scenario in which two component codes indicate suggested corrections that are in agreement, according to various implementations. Referring to FIGS. 1-8, an ECC structure 800 shown in FIG. 8 can be implemented based on mappings such as but not limited to, the mappings 300 and 400, and is a HFPC. That is, the ECC structure 800 may be the result of mapping input bits (e.g., the input bits 301 and 401) to a pseudo triangular matrix (e.g., the pseudo triangular matrices 310 and 410). Interdependent component codes are used to encode and decode the input bits based on the ECC structure 800 similar to described with respect to the mappings 300 and 400. For example, the input bits in row 811 are encoded/decoded using component code C1 810. The input bits in column 821 and row 822 are encoded/decoded using component code C1 820. The input bits in column 831 and row 832 are encoded/decoded using component code Cj 830. The input bits in column 841 and row 842 are encoded/decoded using component code Ck 840. The input bits in column 851 and row 852 are encoded/decoded using component code Cm 850. Each of the columns 821, 831, 841, and 851 is a column in the pseudo triangular matrix 310 or 410. Each of the rows 811, 822, 832, 842, and 852 is a row in the pseudo triangular matrix 310 or 410. The ECC structure 800 therefore is a pseudo triangular matrix having m components. Each of C1 810, Ci 820, Cj 830, Ck 840, and Cm 850 can be a BCH component code. For the sake of clarity, other component codes (and rows and columns associated thereof) and blocks other than those with suggested corrections are omitted.

As used herein, a suggested correction (e.g., suggested bit flip) for one or more bits (referred to as error candidate or error location) is schematically illustrated as a given block in the ECC structure 800. Each block contains multiple bits, and a suggested correction corresponds to one of those multiple bits. Error detection using Ci 820 yields suggested corrections at blocks 823, 824, and 825. Error detection using Cm 850 yields suggested corrections at blocks 825, 833, and 843. Error detection using each component code is performed independently. Therefore, Ci 820 and Cm 850 agree on the suggested correction at block 825, and the strong accept rule applies. All suggested corrections by Ci 820 and Cm 850 are forced and fixed (accepted), and marked as high reliability (strong-accept solutions). That is, in addition to the suggested correction at block 825, the suggested corrections at blocks 823, 824, 833, and 843 are also forced and fixed (accepted). The decoder implements suggest corrections on all such error candidates, and continues to a next Safe+ sub iteration 505.

In response to determining that at least one strong-accept solution is found (710:YES), the decoder performs cross-component undo, at 740. Cross-component undo refers to the decoder removing all other error candidates that are not strong-accept solutions.

On the other hand, in response to determining that at least one strong-accept solution is not found (710:NO), the decoder performs the SLA detection at 715. By performing SLA detection, one or more suggested corrections determined during the safe detection (at 705) that have the lowest probability of false correction are identified. Such identification is performed with minimal induced bias of the error candidates. In some arrangements, performing the SLA detection includes evaluating, by the decoder, each error candidate by determining whether a cross component code can be solved by implementing a suggested correction at the error candidate. Implementing a suggested correction refers to flipping the bit at the suggested error candidate.

For example, in response to determining that a cross component code has a suggested solution due to test implementing an error candidate determined from safe detection (e.g., at 705), the error candidates corresponding to the suggest solution are stored in memory for further evaluation. In SLA detection, for each error candidate determined in safe detection (referred to as originator error candidate), the decoder generates derived error candidates by performing a single bit flip at the originator error candidate and attempts to solve the associated cross component codes. An originator component code is a component code having an originator error candidate, the test implementation (bit flip) of which generates a successful solution on a cross component code (a derived component code). The originator error candidates for the single bit flip are those error candidates found using originator component codes and saved during the safe detection at 705. For each originator error candidate, the decoder saves a candidate solution resulting in successful evaluation of any cross component code, referred to as a derived component code. After test implementing all originator error candidates, one at a time, a list of derived error candidates is generated. This list may include, in some cases, several error candidates for a same derived component code.

After the list is generated, the decoder determines whether a derived error candidate (generated in SLA at 715) agrees with an originator error candidate (generated in safe detection at 705). In response to determining such an agreement, the decoder accepts the suggested corrections determined based on the originator and derived component codes associated with the agreement. That is, the decoder accepts suggested correction on any originator error candidate determined using the originator component code and any derived error candidate determined using a derived component code. When such an agreement exist, the originator/derived error candidates of the related originator/derived component codes are considered strong-accept solutions.

Figure 9:
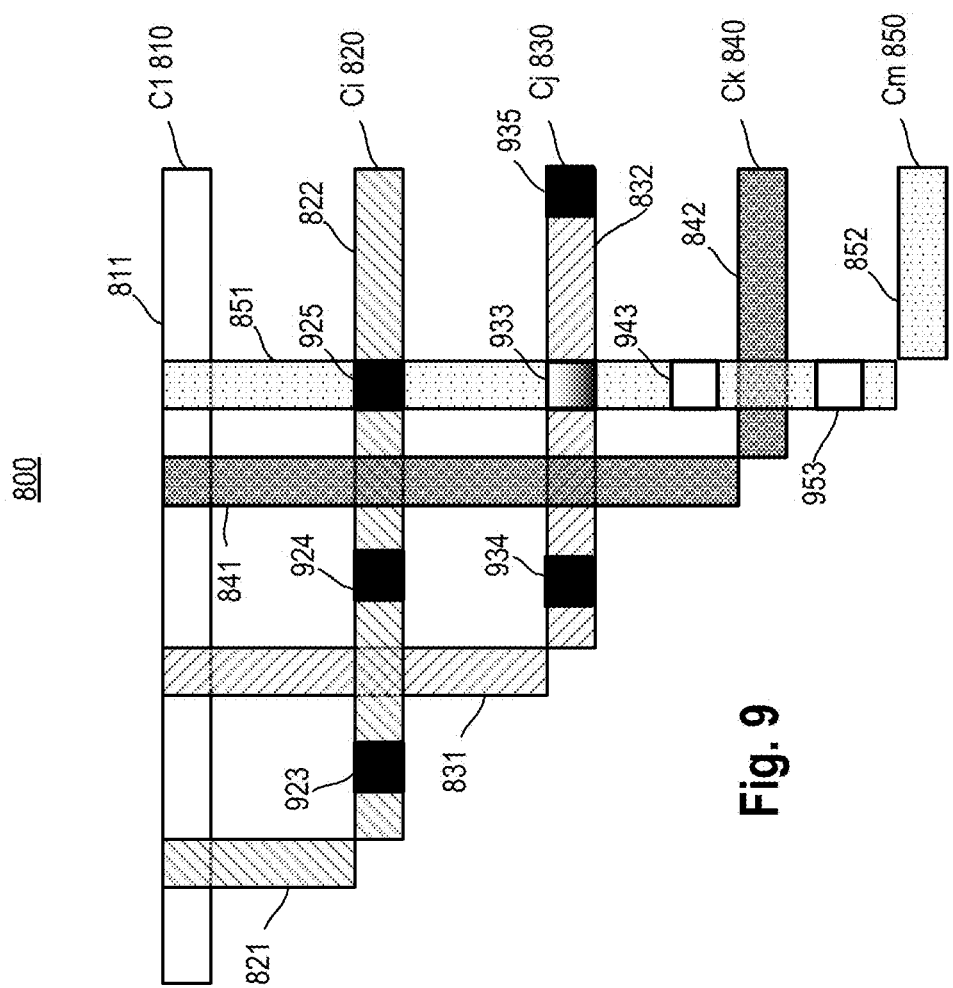
FIG. 9 is a diagram illustrating a decoding scenario in which two component codes indicate suggested corrections that are in agreement after test implementation of a suggested correction, according to various implementations.

FIG. 9 is presented to illustrate one type of strong-accept solutions determined during SLA detection, at 715. FIG. 9 is a diagram illustrating a decoding scenario in which two component codes indicate suggested corrections that are in agreement after test implementation or a suggested correction, according to various implementations. Referring to FIGS. 1-9, the ECC structure 800 shown in FIG. 9 is similar to that shown in FIG. 8, but with different error candidates.

Error detection during safe detection (at 705) using Ci 820 (originator component code) yields suggested corrections at blocks 923, 924, and 925 (originator error candidates). Error detection during safe detection (at 705) using Cj 830 (originator component code) yields suggested corrections at blocks 933, 934, and 935 (originator error candidates). The originator error candidates determined using Ci 820 and Cj 830 do not agree. Those originator error candidates are saved in memory. During SLA detection at 715, the decoder test implements (e.g., by bit flipping) each originator error candidate saved in memory and attempts to solve each cross component code (derived component code) that crosses or intersects with the originator component code to which that originator error candidate belongs. For example, in response to bit flipping an originator error candidate (e.g., block 925) determined using originator component code Ci 820, the decoder attempts to solve at least one cross component code, including the cross component code Cm 850 (derived component code) which intersects with Ci 820 at the flipped originator error candidate. When the error candidate 925 is bit flipped (implementing the suggested correction at the error candidate 925), a solution of three derived error candidates at 933, 943, and 953 are found. As shown, originator component code Cj 830 and derived component code Cm 850 agree on the suggested correction at block 933, and the strong accept rule applies. All suggested corrections by originator component code Cj 830 and derived component code Cm 850, as well as originator component code Ci 820 are forced and fixed (accepted), and marked as high reliability (strong-accept solutions). That is, in addition to the suggested correction at block 933, the suggested corrections at blocks 923, 924, 925, 934, 935, 925, 943, and 953 are also forced and fixed (accepted). The decoder implements suggest correction on all such error candidates, and continues to a next Safe+ sub iteration 505. All other solutions to any blocks (e.g., the bits therein) are rejected.

In some examples in which the decoder determines that none of the derived error candidates generated by test implementing suggested corrections at the originator error candidates agrees with any originator error candidate, the decoder can seek to determine whether there is an agreement between two derived error candidates generated during SLA detection, at 715, for example, by flipping bits of originator error candidates. In response to determining that two derived error candidates generated by two derived component codes are the same after an originator error candidate determined using an originator component code is test implemented (bit flipped), the originator error candidates determined using the originator component code are accepted as highly reliable fixes (e.g., strong-accept solutions).

Figure 10:
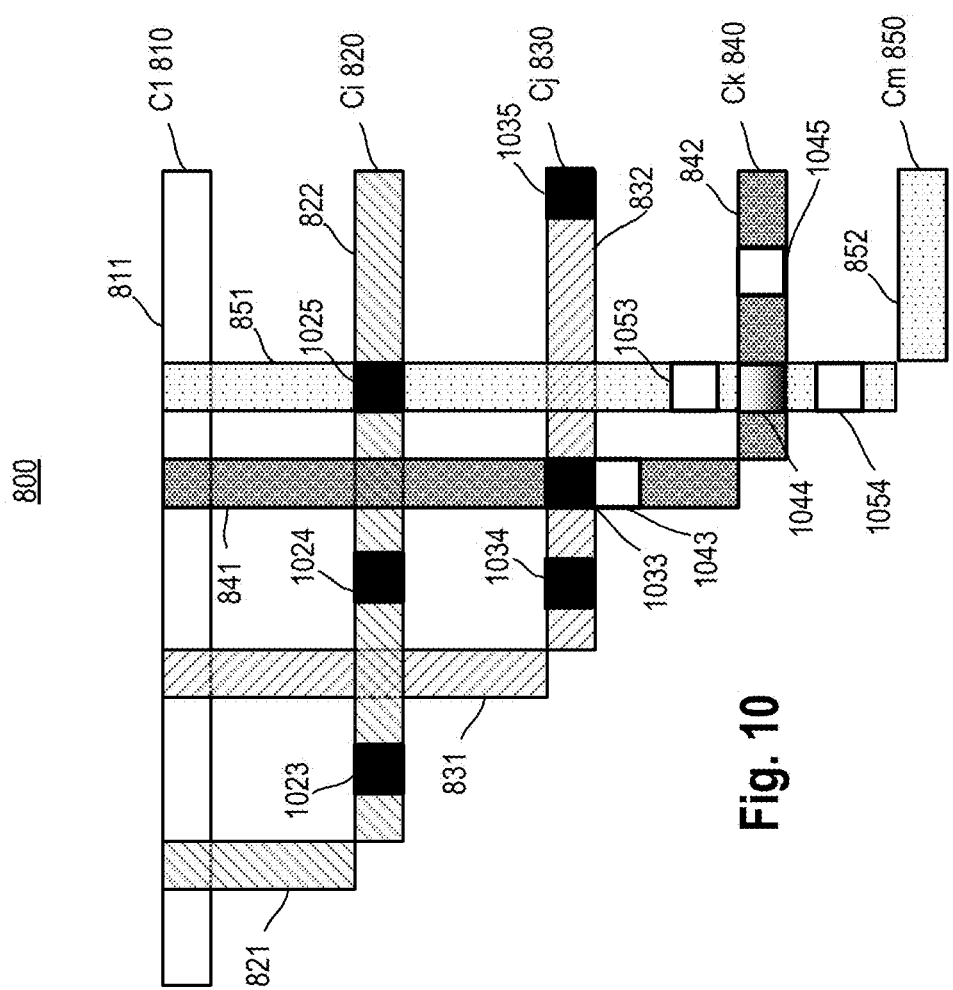
FIG. 10 is a diagram illustrating a decoding scenario in which two component codes indicate suggested corrections that are in agreement after test implementation of a suggested correction, according to various implementations.

In that regard, FIG. 10 is presented to illustrate another type of strong-accept solutions determined during SLA detection, at 715. FIG. 10 is a diagram illustrating a decoding scenario in which two component codes indicate suggested corrections that are in agreement after test implementation of a suggested correction, according to various implementations. Referring to FIGS. 1-10, the ECC structure 800 shown in FIG. 10 is similar to that shown in FIGS. 8 and 9, but with different suggested error candidates.

Error detection during safe detection (at 705) using originator component code Ci 820 yields suggested corrections at blocks 1023, 1024, and 1025 (originator error candidates). Error detection during safe detection (at 705) using originator component code Cj 830 yields suggested corrections at blocks 1033, 1034, and 1035 (originator error candidates). The originator error candidates determined using Ci 820 and Cj 830 do not agree. Those originator error candidates are saved in memory. During SLA detection at 715, the decoder test implements (e.g., by bit flipping) each originator error candidate saved in memory and attempts to solve other component codes. For example, in response to bit flipping an originator error candidate (e.g., block 1025) determined using Ci 820, the decoder attempts to solve all cross component codes that intersects with Ci 820, including the derived component code Cm 850. When the originator error candidate 1025 is bit flipped (implementing the suggested correction at the originator error candidate 1025), a solution of three derived error candidates at 1053, 1044, and 1054 are found. In addition, in response to bit flipping an originator error candidate (e.g., block 1033) determined using Cj 830, the decoder attempts to solve all cross component codes that that intersects with Cj 830, including the derived component code Ck 840. When the originator error candidate 1033 is bit flipped (implementing the suggested correction at the originator error candidate 1033), a solution of three derived error candidates at 1043, 1044, and 1045 are found. As shown, derived component codes Ck 840 and Cm 850 agree on the suggested correction at block 1044, and the strong accept rule applies. All suggested corrections by derived component codes Ck 840 and Cm 850, as well as originator component codes Ci 820 and Cj 830 are forced and fixed (accepted), and marked as high reliability (strong-accept solutions). That is, in addition to the suggested correction at block 1044, the suggested corrections at blocks 1023, 1024, 1025, 1033, 1034, 1035, 1043, 1045, 1053, and 1054 are also forced and fixed (accepted). The decoder implements suggest correction on all such error candidates, and continues to a next Safe+ sub iteration 505. All other solutions to any blocks (e.g., the bits therein) are rejected.

In some examples in which the decoder determines that (1) none of the derived error candidates generated by test implementing suggested correction at each of the originator error candidates agrees with any originator error candidate; and (2) no two of the derived error candidates generated by test implementing suggested corrections at each of the originator error candidates agree with each other, the decoder can seek to determine whether there is an agreement among subsequent derived error candidates generated during SLA detection, at 715, for example, by flipping bits of the derived error candidates determined during the SLA detection.

In response to determining that two subsequent derived error candidates generated by two component codes are the same after an additional error candidate determined using a component code (not an originator component code) during the SLA detection is test implemented (bit flipped), the associated subsequent derived error candidate, derived error candidates, and originator error candidates are accepted as highly reliable fixes (e.g., strong-accept solutions).

Figure 11:
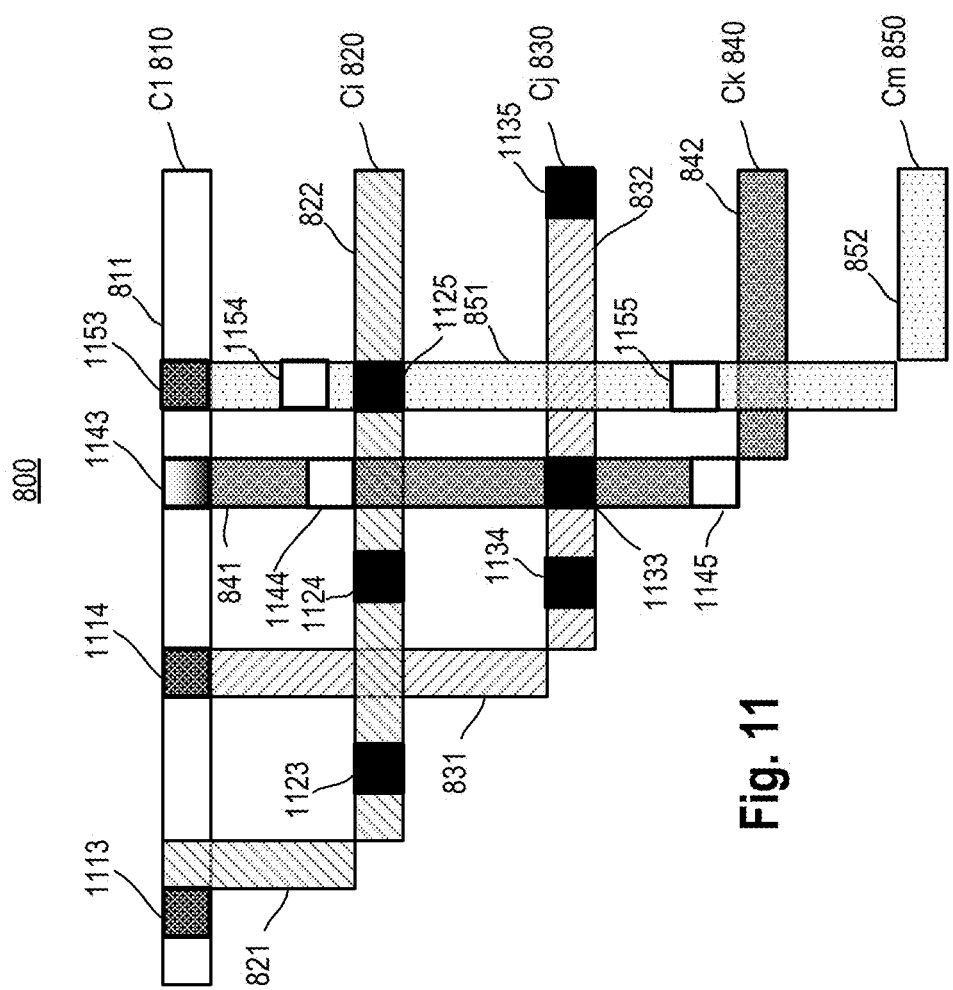
FIG. 11 is a diagram illustrating a decoding scenario in which two component codes indicate suggested corrections that are in agreement after test implementation of suggested corrections, according to various implementations.

In that regard, FIG. 11 is presented to illustrate another type of strong-accept solutions determined during SLA detection, at 715. FIG. 11 is a diagram illustrating a decoding scenario in which two component codes indicate suggested corrections that are in agreement after test implementation of suggested corrections, according to various implementations. Referring to FIGS. 1-11, the ECC structure 800 shown in FIG. 11 is similar to that shown in FIGS. 8-10, but with different suggested error candidates.

Error detection during safe detection (at 705) using originator component code Ci 820 yields suggested corrections at blocks 1123, 1124, and 1125 (originator error candidates). Error detection during safe detection (at 705) using originator component code Cj 830 yields suggested corrections at blocks 1133, 1134, and 1135 (originator error candidates). The originator error candidates determined using Ci 820 and Cj 830 do not agree. Those originator error candidates are saved in memory.

During a first round of SLA detection at 715, the decoder test implements (e.g., by bit flipping) each originator error candidate saved in memory and attempts to solve other component codes. For example, in response to bit flipping an originator error candidate (e.g., block 1125) determined using Ci 820, the decoder attempts to solve all cross component codes that intersects with Ci 820, including the derived component code Cm 850. When the originator error candidate 1125 is bit flipped (implementing the suggested correction at the originator error candidate 1125), a solution of three derived error candidates at 1153, 1154, and 1155 are found. In addition, in response to bit flipping an originator error candidate (e.g., block 1133) determined using Cj 830, the decoder attempts to solve all cross component codes that that intersects with Cj 830, including the derived component code Ck 840. The derived error candidates are saved in memory. When the originator error candidate 1133 is bit flipped (implementing the suggested correction at the originator error candidate 1133), a solution of three derived error candidates at 1143, 1144, and 1145 are found. As shown, none of the error candidates 1123, 1124, 1125, 1133, 1134, 1135, 1143, 1144, 1145, 1153, 1154, and 1155 agree.

During a second round of SLA detection at 715, the decoder test implements (e.g., by bit flipping) each derived error candidate saved in memory and attempts to solve other component codes. For example, in response to bit flipping a derived error candidate (e.g., block 1153) determined using Cm 850, the decoder attempts to solve all cross component codes that intersects with Cm 850, including the subsequent derived component code C1 810. When the derived error candidate 1153 is bit flipped (implementing the suggested correction at the derived error candidate 11553), a solution of three derived error candidates at 1113, 1114, and 1143 are found. All suggested corrections by the subsequent derived component code C1 810, the derived component codes Ck 840 and Cm 850, as well as originator component codes Ci 820 and Cj 830 are forced and fixed (accepted), and marked as high reliability (strong-accept solutions). That is, in addition to the suggested correction at block 1143, the suggested corrections at blocks 1113, 1114, 1123, 1124, 1125, 1133, 1134, 1135, 1144, 1145, 1153, 1154, and 1155 are also forced and fixed (accepted). The decoder implements suggest correction on all such error candidates, and continues to a next Safe+ sub iteration 505. All other solutions to any blocks (e.g., the bits therein) are rejected.

Accordingly, at 715, one or more rounds of SLA detection can be performed by the decoder. In each round, the decoder test implements one or more error candidates to solve other component codes to generate additional error candidates. The decoder then determines whether any of the additional error candidates agree with another one of the additional error candidates or with any previously saved error candidates. In response to determining an agreement, any error candidates corresponding to relevant component codes are accepted as strong-accept solutions. On the other hand, in response to determining that there is no agreement, the additional error candidates generated in the current round is saved in memory, and become a part of the previously saved error candidates for the next SLA round.

In some examples, during the SLA detection at 715, a given derived component code may have more than one derived error candidate. In such examples, several derived candidates for a given derived component code are saved, and a search for potential agreements is performed on all derived error candidates of the same derived component code. In the example in which several agreements are found (different agreed error candidates), the decoder chooses the error candidate having the greatest number of agreements or the first detected error candidate if several error candidates have the greatest number of agreements. An agreement refers to a single bit that exists on both an error candidate of a component code and an error candidate of a cross component code (which intersects the component code). The first detected error candidate refers to the error candidate that is detected first in time according to any suitable search order.

In some arrangements, after every round in SLA detection, only a single error candidate is saved per component code, even when there are multiple error candidates for the same component code. The single error candidate is used as initial conditions for next round in SLA detection.

In some examples, blocks 705, 710, 715, and 720 are only performed once per safe+ sub-iteration 505.

The decoder at 720 determines whether strong-accept solutions are found in the SLA detection at 715. In response to determining that strong-accept solutions are found (720: YES), the decoder performs cross-component undo, at 740.

On the other hand, in response to determining that strong-accept solutions are not found (720:NO), the decoder performs safe rejection, at 725. For example, the decoder can determine that the strong-accept solutions are not found in response to determining that no strong-accept solutions are found after a maximum number of SLA rounds. In another example, the decoder can determine that the strong-accept solutions are not found in response to determining that no new additional error candidate is found in the current SLA round.

In safe rejection flow at 725, the decoder determines whether to accept any error candidates determined and saved at 715, before proceeding to the next sub-iteration (505).

In some arrangements, in response to determining that implementing suggest correction on an error candidate of a given component code would result in modifying a solved component code or a component code having a candidate solution, the decoder rejects the error candidate in the current sub-iteration. This does not apply to error candidates identified in 715 (e.g., error candidates that are not the originator error candidate identified at 705) given that the error candidates identified in 715 are derived from an error candidate of the originator error candidates identified at 705.

In some arrangements, in response to determining that in response to determining that implementing suggest correction on a later-determined error candidate of a given component code would result in modifying an earlier-detected, solved component code or an earlier-detected component code having a candidate solution, the solved component code or the component code having the candidate solution is rejected. This applies to error candidates identified in 715 (e.g., error candidates that are not the originator error candidate identified at 705) and the originator error candidates identified at 705, thus allowing higher rejection rate and reducing probability of false correction. In that regard, FIG. 12 illustrates a scenario in which this rule can be implemented.

Figure 12:
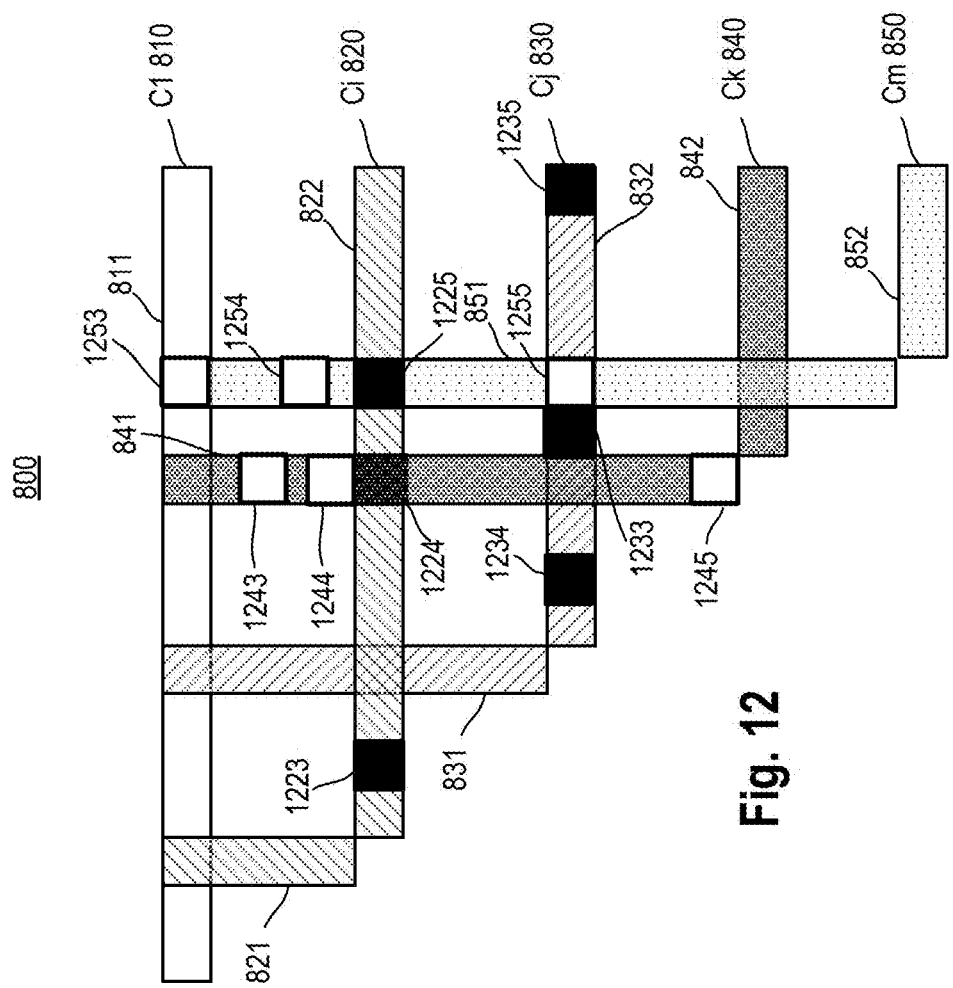
FIG. 12 is a diagram illustrating a decoding scenario in which two component codes indicate suggested corrections that are in conflict, according to various implementations.

FIG. 12 is a diagram illustrating a decoding scenario in which two component codes indicate suggested corrections that are in conflict, according to various implementations. Referring to FIGS. 1-12, the ECC structure 800 shown in FIG. 12 is similar to that shown in FIGS. 8-11, but with different suggested error candidates.

Error detection during safe detection (at 705) using originator component code Ci 820 yields suggested corrections at blocks 1223, 1224, and 1225 (originator error candidates). Error detection during safe detection (at 705) using originator component code Cj 830 yields suggested corrections at blocks 1233, 1234, and 1235 (originator error candidates). The originator error candidates determined using Ci 820 and Cj 830 do not agree. Those originator error candidates are saved in memory.

During SLA detection at 715, the decoder test implements (e.g., by bit flipping) each originator error candidate saved in memory and attempts to solve other component codes. For example, when an originator error candidate is bit flipped, a solution of three derived error candidates at 1243, 1244, and 1245 are found for Ck 840. When an originator error candidate is bit flipped, a solution of three derived error candidates at 1253, 1254, and 1255 are found for Cm 850. Assume that no strong-accept solution is found (720:NO), during safe rejection at 725, in some examples, the error candidates 1233, 1234, 1235 for Cj 830 is rejected given that the subsequently determined error candidate 1255 for Cm 850 suggests correction at an error candidate different from the error candidates 1233, 1234, 1235 determined for Cj 830 during safe detection at 705.

At 730, the decoder performs first-time solved forcing. For example, the decoder can determine that an error candidate is accepted at safe rejection (725), that the total number of error candidates (including the error candidate) accepted at safe rejection is t−1 or less, and that the error candidate is solved for the first time during decoding (the error candidate has not been previously found to be an error candidate before in the method 500). The total number of error candidates found for each component code being t−1 or less corresponds to a lower probability of false correction. In response to identifying such an error candidate, the decoder marks this error candidate as a highly reliable fix (forcing). In other words, in response to determining such an error candidate exists, a strong-accept solution has been found (735:YES), and the method 700 proceeds to 740.

After block 740 or in response to determining that a strong-accept solution is not found (735:NO), the method 700 (an iteration of the Safe+ flow with rejection at 605, 625, or 635) ends. In response to determining that at least one strong-accept solution (including at least one error candidate) is found in the method 700 (e.g., 710:YES, 720:YES, or 735:YES), the suggested correction on any strong-accept solution is accepted, and a candidate is found (610:YES, 630:YES, or 640:YES). In other words, in response to determining that at least one strong-accept solution (including at least one error candidate) is found in the method 700 (e.g., 710:YES, 720:YES, or 735:YES), the method 500 proceeds to a next Safe+ sub-iteration at 505.

Figure 13:
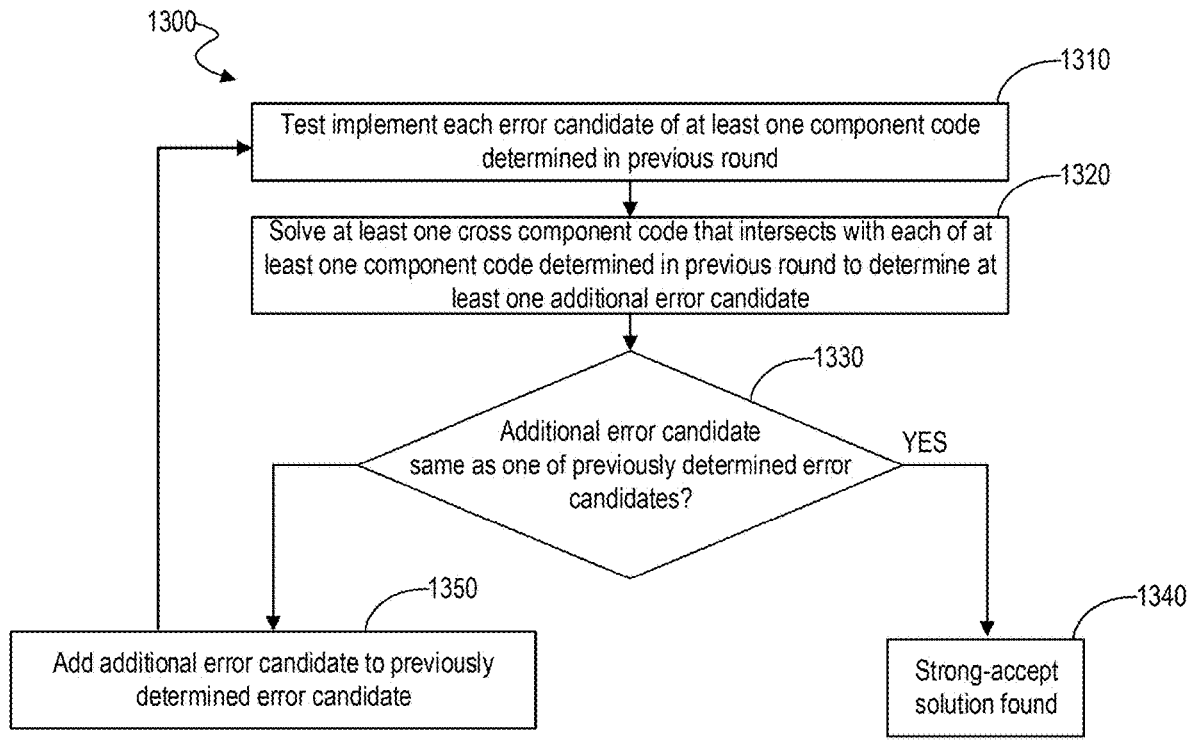
FIG. 13 is a process flow diagram illustrating an example method for performing a look-ahead detection, according to some implementations.

FIG. 13 is a process flow diagram illustrating an example method 1300 for performing a look-ahead detection, according to some implementations. Referring to FIGS. 1-13, the method 1300 is an example implementation of 710. The method 1300 can be performed by the decoder of the ECC encoder/decoder 102 or the decoder of the ECC encoder/decoder 112, referred to as the "decoder."

For each SLA round, at 1310, the decoder test implements each error candidate of at least one component code. In the example in which the current SLA round is the first round, the at least one component code refers to any originator component code that has at least one originator error candidate. In the example in which the current SLA round is not the first round, the at least one component code refers to any new component code (e.g., a derived component code, a subsequent derived component, and so on) that has at least one error candidate determined in the previous round.

At 1320, the decoder determines at least one additional error candidate by solving at least one cross component code that intersects with each of the at least one component code. Any additional error candidate determined in the current round corresponds to a component code that is determined in the current round. The additional error candidate can be a derived error candidate or a subsequent derived error candidate.

At 1330, the decoder determines whether the at least one additional error candidate is same as one of previously determined error candidates. As described, any error candidate determined in 705 and 715 are stored in memory. Thus, a list of previously determined error candidates is available.

In response to determining that one of the additional error candidate is the same as one of the previously determined error candidates (e.g., an agreement is identified) (1330: YES), strong-accept solution is found, at 1340 (720:YES). On the other hand, in response to determine that none of the at least one additional error candidate is same as any of the previously determined error candidates, the at least one additional error candidate is added to the list of previously determined error candidates at 1350, and the method 1300 proceeds to a next SLA round.

Figure 14:
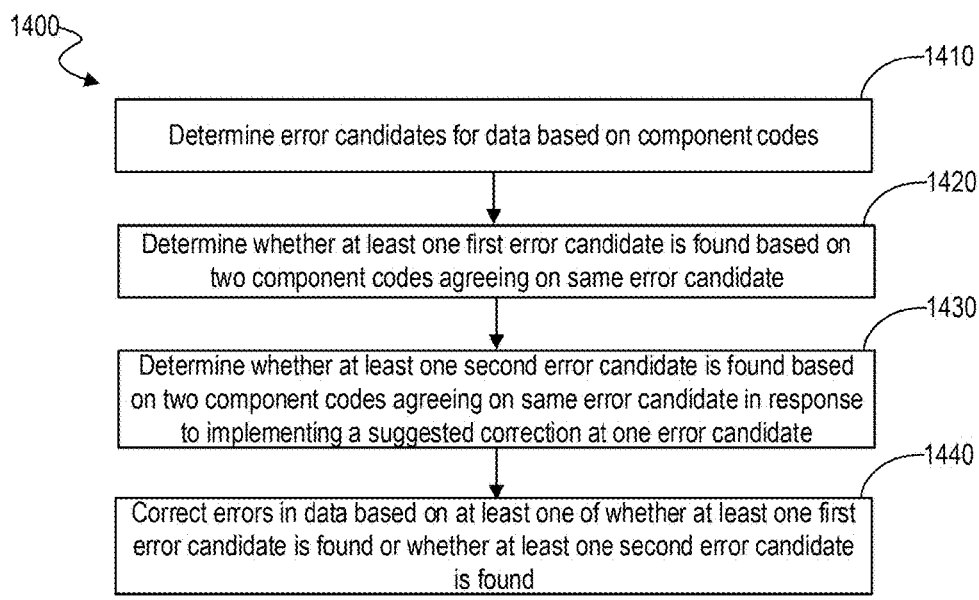
FIG. 14 is a process flow diagram illustrating an example method for performing hard decoding, according to some implementations.

FIG. 14 is a process flow diagram illustrating an example method 1400 for performing a look-ahead detection, according to some implementations. Referring to FIGS. 1-14, the methods 500, 600, 700, and 1300 are particular implementations of one or more aspects of the method 1400. The method 1400 can be performed by the decoder of the ECC encoder/decoder 102 or the decoder of the ECC encoder/decoder 112, referred to as the "decoder."

At 1410, the decoder determines error candidates for the data based on component codes. In some examples, determining the error candidates for the data based on the component codes includes determining the error candidates by decoding a codeword based on the component codes. The codeword corresponds to an input payload having input bits. The input bits are organized into a pseudo triangular matrix. Each row or column of the pseudo triangular matrix differs from an adjacent row or column by two or more bits. The input bits are encoded using the component codes based on mapping each of the input bits to two or more of the component codes based on the pseudo triangular matrix. The pseudo triangular matrix includes a plurality of blocks. Each of the plurality of blocks includes two or more of the input bits. The two component codes encode a same block of the plurality of blocks.

At 1420, the decoder determines whether at least one first error candidate from the error candidates is found based on two of the component codes agreeing on a same error candidate.

At 1430, the decoder determines whether at least one second error candidate is found based on two of the component codes agreeing on a same error candidate, in response to implementing a suggested correction at one of the error candidates. In some examples, determining whether the at least one second error candidate is found includes performing one or more rounds of detection. A current round of the one or more rounds of detection includes test implementing each error candidate of at least one component code, determining at least one additional error candidate by solving at least one cross component code that intersects with each of the at least one component code (the at least one additional error candidate corresponds to at least one component code determined in the current round), and determining whether the at least one additional error candidate is same as one of previously determined error candidates.

The current round of the one or more rounds of detection further includes in response to determining that one of the at least one additional error candidate is same as the one of the previously determined error candidates, determining that the at least one second error candidate is found. The current round of the one or more rounds of detection further includes in response to determining that none of the at least one additional error candidate is same as any of the previously determined error candidates, proceed to a next round of the one or more round. The at least one additional error candidate is added to the previously determined error candidates for the next round.

At 1440, the decoder corrects errors in the data based on at least one of whether the at least one first error candidate is found or whether the at least one second error candidate is found. Correcting the errors in the data based on at least one of whether the at least one first error candidate is found or whether the at least one second error candidate is found includes one or more of: in response to determining that the at least one first error candidate is found, accepting the at least one first error candidate, or in response to determining that the at least one second error candidate is found, accepting the at least one second error candidate.

In some examples, the method 1400 further includes, in response to determining that the two of the component codes agree on the same error candidate, determining that the at least one first error candidate is found. The at least one first error candidate includes the one of the same error candidate and one or more of at least one error candidate determined using a first component code of the two of the component codes, or at least one error candidate determined using a second component code of the two of the component codes.

In some examples, the method 1400 further includes, in response to determining that no two of the component codes agree on the same error candidate, determining whether the at least one second error candidate is found.

In some examples, determining the error candidates for the data based on the component codes includes determining originator error candidates based on originator component codes. Determining whether the at least one second error candidate is found includes test implementing suggested correction at one of the originator error candidates (the one of the originator error candidates is determined using a first originator component code of the originator component codes), determining, with the suggested correction implemented, derived error candidates using at least one derived component code that intersects with the first originator component code, and determining whether one of the derived error candidates is same as one of the originator error candidates. Determining whether the at least one second error candidate is found further includes in response to determining that the one of the derived error candidates is same as the one of the originator error candidates, determining that the at least one second error candidate is found. The one of the derived error candidates is determined using a first derived component code of the at least one derived component code. The one of the originator error candidates is determined using a second originator component code of the originator component codes. The at least one second error candidate includes the one of the derived error candidates that is same as the one of the originator error candidates and one or more of at least one error candidate determined using the first originator component code, at least one error candidate determined using the first derived component code with the suggested correction implemented, or at least one error candidate determined using the second originator component code.

In some examples, determining the error candidates for the data based on the component codes includes determining originator error candidates based on originator component codes. Determining whether the at least one second error candidate is found includes test implementing a first suggested correction at a first originator error candidate of the originator error candidates (the first originator error candidate is determined using a first originator component code of the originator component codes), determining, with the first suggested correction implemented, first derived error candidates using at least one first derived component code, test implementing a second suggested correction at a second error candidate of the originator error candidates (the second error candidate is determined using a second originator component code of the originator component codes), determining, with the second suggested correction implemented, second derived error candidates using at least one second derived component code, and determining whether one of the first derived error candidates is same as one of the second derived error candidates. Determining whether the at least one second error candidate is found further includes in response to determining that the one of the first derived error candidates is same as the one of the second derived error candidates, determining that the at least one second error candidate is found. The at least one second error candidate includes the one of the first derived error candidates that is same as the one of the second derived error candidates and one or more of at least one error candidate determined using the first originator component code, at least one error candidate determined using the second originator component code, at least one error candidate determined using the first derived component code with the first suggested correction implemented, or at least one error candidate determined using the second derived component code with the second suggested correction implemented.

In some examples, determining the error candidates for the data based on the component codes includes determining originator error candidates based on originator component codes. Determining whether the at least one second error candidate is found includes test implementing a first suggested correction at a first originator error candidate of the originator error candidates, the first originator error candidate is determined using a first originator component code of the originator component codes, determining, with the first suggested correction implemented, a first derived error candidate using a first derived component code, test implementing a second suggested correction at the first derived error candidate, determining, with the second suggested correction implemented, at least one first subsequent derived error candidate using a first subsequent derived component code, test implementing a third suggested correction at a second error candidate of the originator error candidates (the second error candidate is determined using a second originator component code of the originator component codes), determining, with the third suggested correction implemented, second derived error candidates using at least one second derived component code, and determining whether one of the first subsequent derived error candidates is same as one of the second derived error candidates. Determining whether the at least one second error candidate is found further includes in response to determining that the one of the first subsequent derived error candidates is same as the one of the second derived error candidates, determining that the at least one second error candidate is found. The at least one second error candidate includes the one of the first subsequent derived error candidates that is same as the one of the second derived error candidates and one or more of at least one error candidate determined using the first originator component code, at least one error candidate determined using the second originator component code, at least one error candidate determined using the first derived component code with the first suggested correction implemented, at least one error candidate determined using the first subsequent derived component code with the second suggested correction implemented, or at least one error candidate determined using the second derived component code with the third suggested correction implemented.

Accordingly, the methods described herein enable improved error correction capabilities for hard decoding. NAND flash memory devices implementing such methods can improve read performance in applying a single page read for each host request by obtaining correction of higher BER with hard decoding and high throughput encoding/decoding, at low implementation complexity.

Hard decoding at low complexity yields higher reliability given that false correction probability of component codes is reduced within the iterative decoding of a general product code. This is achieved by performing multiple rounds of iterative SLA component codes decoding. In some examples, solutions that lead to independent agreements are ranked as highly reliable (strong-accept) solutions. The solutions leading to the SLA agreements are accepted while high reliability marking are added. The methods further allow rejection of suspicious and contradicting solutions of individual component codes, which are found with the SLA rounds. Moreover, the methods include forcing bits for solved components, to obtain another protection for false correction.

In addition, such embodiments allow efficient hardware implementation. To decode irregular product code structure, a degree-one bits decoding algorithm is used, such that a dedicated decoder processing is applied to bits which have degree-one encoding protection.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storages, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for decoding data read from a non-volatile storage device, comprising:
   determining, by a decoder, error candidates for the data based on component codes;
   determining, by the decoder, whether at least one first error candidate from the error candidates is found based on two of the component codes agreeing on a same error candidate;
   implementing a suggested correction at one of the error candidates when two of the component codes do not agree on a same error candidate;
   determining, by the decoder, whether at least one second error candidate is found based on two of the component codes agreeing on a same error candidate in response to the implementing of the suggested correction at the one of the error candidates; and
   correcting errors in the data based on at least one of whether the at least one first error candidate is found or whether the at least one second error candidate is found.

2. The method of claim 1, wherein
   determining the error candidates for the data based on the component codes comprises determining the error candidates by decoding a codeword based on the component codes;
   the codeword corresponds to an input payload having input bits;
   the input bits are organized into a pseudo triangular matrix;
   each row or column of the pseudo triangular matrix differs from an adjacent row or column by two or more bits; and
   the input bits are encoded using the component codes based on mapping each of the input bits to two or more of the component codes based on the pseudo triangular matrix.

3. The method of claim 2, wherein
   the pseudo triangular matrix comprises a plurality of blocks;
   each of the plurality of blocks comprises two or more of the input bits; and
   the two component codes encode a same block of the plurality of blocks.

4. The method of claim 1, wherein correcting the errors in the data based on at least one of whether the at least one first error candidate is found or whether the at least one second error candidate is found comprises one or more of:
   in response to determining that the at least one first error candidate is found, accepting the at least one first error candidate; or
   in response to determining that the at least one second error candidate is found, accepting the at least one second error candidate.

5. The method of claim 1, further comprising in response to determining that the two of the component codes agree on the same error candidate, determining that the at least one first error candidate is found, wherein the at least one first error candidate comprises the one of the same error candidate and one or more of:
   at least one error candidate determined using a first component code of the two of the component codes; or
   at least one error candidate determined using a second component code of the two of the component codes.

6. The method of claim 1, further comprising in response to determining that no two of the component codes agree on the same error candidate, determining whether the at least one second error candidate is found.

7. The method of claim 1, wherein
   determining whether the at least one second error candidate is found comprises performing one or more rounds of detection;
   a current round of the one or more rounds of detection comprises:
      test implementing each error candidate of at least one component code;
      determining at least one additional error candidate by solving at least one cross component code that intersects with each of the at least one component code, the at least one additional error candidate corresponds to at least one component code determined in the current round; and
      determining whether the at least one additional error candidate is same as one of previously determined error candidates.

8. The method of claim 7, the current round of the one or more rounds of detection further comprises:
   in response to determining that one of the at least one additional error candidate is same as the one of the previously determined error candidates, determining that the at least one second error candidate is found; and
   in response to determining that none of the at least one additional error candidate is same as any of the previously determined error candidates, proceed to a next round of the one or more round, wherein the at least one additional error candidate is added to the previously determined error candidates for the next round.

9. The method of claim 1, wherein
   determining the error candidates for the data based on the component codes comprises determining originator error candidates based on originator component codes;
   determining whether the at least one second error candidate is found comprises:
      test implementing suggested correction at one of the originator error candidates, the one of the originator error candidates is determined using a first originator component code of the originator component codes;
      determining, with the suggested correction implemented, derived error candidates using at least one derived component code that intersects with the first originator component code; and
      determining whether one of the derived error candidates is same as one of the originator error candidates.

10. The method of claim 9, wherein determining whether the at least one second error candidate is found further comprises:
    in response to determining that the one of the derived error candidates is same as the one of the originator error candidates, determining that the at least one second error candidate is found, wherein the one of the derived error candidates is determined using a first derived component code of the at least one derived component code, and the one of the originator error candidates is determined using a second originator component code of the originator component codes;

the at least one second error candidate comprises the one of the derived error candidates that is same as the one of the originator error candidates and one or more of:

at least one error candidate determined using the first originator component code;

at least one error candidate determined using the first derived component code with the suggested correction implemented; or at least one error candidate determined using the second originator component code.

11. The method of claim 1, wherein determining the error candidates for the data based on the component codes comprises determining originator error candidates based on originator component codes;

determining whether the at least one second error candidate is found comprises:

test implementing a first suggested correction at a first originator error candidate of the originator error candidates, the first originator error candidate is determined using a first originator component code of the originator component codes;

determining, with the first suggested correction implemented, first derived error candidates using at least one first derived component code;

test implementing a second suggested correction at a second error candidate of the originator error candidates, the second error candidate is determined using a second originator component code of the originator component codes;

determining, with the second suggested correction implemented, second derived error candidates using at least one second derived component code; and determining whether one of the first derived error candidates is same as one of the second derived error candidates.

12. The method of claim 11, wherein determining whether the at least one second error candidate is found further comprises:

in response to determining that the one of the first derived error candidates is same as the one of the second derived error candidates, determining that the at least one second error candidate is found, wherein the at least one second error candidate comprises the one of the first derived error candidates that is same as the one of the second derived error candidates and one or more of:

at least one error candidate determined using the first originator component code;

at least one error candidate determined using the second originator component code;

at least one error candidate determined using the first derived component code with the first suggested correction implemented; or at least one error candidate determined using the second derived component code with the second suggested correction implemented.

13. The method of claim 1, wherein determining the error candidates for the data based on the component codes comprises determining originator error candidates based on originator component codes;

determining whether the at least one second error candidate is found comprises:

test implementing a first suggested correction at a first originator error candidate of the originator error candidates, the first originator error candidate is determined using a first originator component code of the originator component codes;

determining, with the first suggested correction implemented, a first derived error candidate using a first derived component code;

test implementing a second suggested correction at the first derived error candidate;

determining, with the second suggested correction implemented, at least one first subsequent derived error candidate using a first subsequent derived component code;

test implementing a third suggested correction at a second error candidate of the originator error candidates, the second error candidate is determined using a second originator component code of the originator component codes;

determining, with the third suggested correction implemented, second derived error candidates using at least one second derived component code; and determining whether one of the first subsequent derived error candidates is same as one of the second derived error candidates.

14. The method of claim 13, wherein determining whether the at least one second error candidate is found further comprises:

in response to determining that the one of the first subsequent derived error candidates is same as the one of the second derived error candidates, determining that the at least one second error candidate is found, wherein the at least one second error candidate comprises the one of the first subsequent derived error candidates that is same as the one of the second derived error candidates and one or more of:

at least one error candidate determined using the first originator component code;

at least one error candidate determined using the second originator component code;

at least one error candidate determined using the first derived component code with the first suggested correction implemented;

at least one error candidate determined using the first subsequent derived component code with the second suggested correction implemented; or at least one error candidate determined using the second derived component code with the third suggested correction implemented.

15. An error correction system, comprising processing circuits configured to:

determine error candidates for the data based on component codes;

determine whether at least one first error candidate from the error candidates is found based on two of the component codes agreeing on a same error candidate;

implementing a suggested correction at one of the error candidates when two of the component codes do not agree on a same error candidate;

determine whether at least one second error candidate is found based on two of the component codes agreeing on a same error candidate in response to the implementing of the suggested correction at the one of the error candidates; and correct errors in the data based on at least one of whether the at least one first error candidate is found or whether the at least one second error candidate is found.

16. Non-transitory computer-readable media comprising non-transitory storage media configured for storing computer-readable instructions, such that when executed, causes a processing circuit to decode data stored in a non-volatile storage device by:

determining error candidates for the data based on component codes;

determining whether at least one first error candidate from the error candidates is found based on two of the component codes agreeing on a same error candidate;

implementing a suggested correction at one of the error candidates when two of the component codes do not agree on a same error candidate;

determining whether at least one second error candidate is found based on two of the component codes agreeing on a same error candidate in response to the implementing of the suggested correction at the one of the error candidates; and correcting errors in the data based on at least one of whether the at least one first error candidate is found or whether the at least one second error candidate is found.

17. The non-transitory computer-readable media of claim 16, wherein correcting the errors in the data based on at least one of whether the at least one first error candidate is found or whether the at least one second error candidate is found comprises one or more of:

in response to determining that the at least one first error candidate is found, accepting the at least one first error candidate; or in response to determining that the at least one second error candidate is found, accepting the at least one second error candidate.

18. The non-transitory computer-readable media of claim 16, wherein the processing circuit is further configured to: in response to determining that the two of the component codes agree on the same error candidate, determining that the at least one first error candidate is found, wherein the at least one first error candidate comprises the one of the same error candidate and one or more of:

at least one error candidate determined using a first component code of the two of the component codes; or at least one error candidate determined using a second component code of the two of the component codes.

19. The non-transitory computer-readable media of claim 16, wherein the processing circuit is further configured to: in response to determining that no two of the component codes agree on the same error candidate, determining whether the at least one second error candidate is found.

20. The non-transitory computer-readable media of claim 16, wherein determining whether the at least one second error candidate is found comprises performing one or more rounds of detection;

a current round of the one or more rounds of detection comprises:

test implementing each error candidate of at least one component code;

determining at least one additional error candidate by solving at least one cross component code that intersects with each of the at least one component code, the at least one additional error candidate corresponds to at least one component code determined in the current round; and determining whether the at least one additional error candidate is same as one of previously determined error candidates.

* * * * *